(12) United States Patent
McShane et al.

(10) Patent No.: US 9,496,720 B2
(45) Date of Patent: *Nov. 15, 2016

(54) SYSTEM FOR AUTOMATICALLY GATHERING BATTERY INFORMATION

(75) Inventors: Stephen J. McShane, Oak Brook, IL (US);
(Continued)

(73) Assignee: Midtronics, Inc., Willowbrook, IL (US)

(*) Notice: Subject to any disclaimer, the term of this patent is extended or adjusted under 35 U.S.C. 154(b) by 165 days.

This patent is subject to a terminal disclaimer.

(21) Appl. No.: 13/357,306

(22) Filed: Jan. 24, 2012

(65) Prior Publication Data
US 2012/0182132 A1 Jul. 19, 2012

Related U.S. Application Data

(63) Continuation-in-part of application No. 12/416,457, filed on Apr. 1, 2009, now Pat. No. 8,344,685, which is
(Continued)

(51) Int. Cl.
*H04Q 5/22* (2006.01)
*H02J 7/00* (2006.01)
(Continued)

(52) U.S. Cl.
CPC .......... *H02J 7/0009* (2013.01); *H01M 10/486* (2013.01); *H01M 10/488* (2013.01);
(Continued)

(58) Field of Classification Search
CPC ............... G06K 7/0008; H01M 10/486; G01R 31/3627
(Continued)

(56) References Cited

U.S. PATENT DOCUMENTS

| 85,553 A | 1/1869 | Adams ........................... 33/472 |
| 2,000,665 A | 5/1935 | Neal ............................ 439/440 |

(Continued)

FOREIGN PATENT DOCUMENTS

| CN | 2470964 Y | 1/2002 |
| CN | 201063352 Y | 5/2008 |

(Continued)

OTHER PUBLICATIONS

Second Chinese Office Action for Chinese Patent Application No. 200810190887.X, dated Jan. 22, 2013, 11 pages.
(Continued)

*Primary Examiner* — Verna Brown
(74) *Attorney, Agent, or Firm* — Westman, Champlin & Koehler, P.A.

(57) ABSTRACT

A method and apparatus is provided in which a radio frequency identification (RIFD) tag is associated with the storage battery and is used in conjunction with a battery test, battery charger, or other battery maintenance. A cable configured to be affixed to the storage battery. The cable is configured to store information and wirelessly communicate the information to a battery tester. A battery maintenance device configured to couple to the battery and to perform battery maintenance on the battery through the cable. The battery maintenance device includes wireless communication circuitry configured to communicate with a memory of the cable.

27 Claims, 10 Drawing Sheets

(75) Inventors: Todd J. Stukenberg, Indian Head Park, IL (US); Kevin I. Bertness, Batavia, IL (US); John S. Philbrook, Crown Point, IN (US)

Related U.S. Application Data a continuation-in-part of application No. 11/207,419, filed on Aug. 19, 2005, now abandoned, application No. 13/357,306, which is a continuation-in-part of application No. 12/416,453, filed on Apr. 1, 2009, now Pat. No. 8,436,619, application No. 13/357,306, which is a continuation-in-part of application No. 12/416,445, filed on Apr. 1, 2009, now Pat. No. 8,442,877.

(60) Provisional application No. 60/603,078, filed on Aug. 20, 2004.

(51) Int. Cl.
*H01M 10/48* (2006.01)
*G01R 31/36* (2006.01)
*H01M 2/02* (2006.01)

(52) U.S. Cl.
CPC ....... *G01R 31/3627* (2013.01); *G01R 31/3655* (2013.01); *H01M 2/0267* (2013.01); *H02J 2007/0098* (2013.01)

(58) Field of Classification Search
USPC .......................................... 340/10.51, 539.1
See application file for complete search history.

(56) References Cited

U.S. PATENT DOCUMENTS

| | | | |
|---|---|---|---|
| 2,417,940 A | 3/1947 | Lehman | 200/61.25 |
| 2,437,772 A | 3/1948 | Wall | 324/523 |
| 2,514,745 A | 7/1950 | Dalzell | 324/115 |
| 2,727,221 A | 12/1955 | Springg | 340/447 |
| 3,025,455 A | 3/1962 | Jonsson | 323/369 |
| 3,178,686 A | 4/1965 | Mills | 340/447 |
| 3,215,194 A | 11/1965 | Sununu et al. | 165/80.3 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,699,433 A | 10/1972 | Smith, Jr. | 324/523 |
| 3,729,989 A | 5/1973 | Little | 73/862.192 |
| 3,745,441 A | 7/1973 | Soffer | 290/14 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strzelewicz | 324/170 |
| 3,816,805 A | 6/1974 | Terry | 320/123 |
| 3,850,490 A | 11/1974 | Zehr | 439/822 |
| 3,857,082 A | 12/1974 | Van Opijnen | 320/143 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,920,284 A | 11/1975 | Lane et al. | 303/122.06 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,610 A | 6/1980 | Gordon | 701/33.9 |
| 4,207,611 A | 6/1980 | Gordon | 701/33 |
| 4,217,645 A | 8/1980 | Barry et al. | 702/63 |
| 4,218,745 A | 8/1980 | Perkins | 324/66 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,425,791 A | 1/1984 | Kling | 73/116.02 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,626,765 A | 12/1986 | Tanaka | 320/127 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| D299,909 S | 2/1989 | Casey | D10/77 |

(56) References Cited

U.S. PATENT DOCUMENTS

| | | | |
|---|---|---|---|
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koenck | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/425 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/426 |
| D330,338 S | 10/1992 | Wang | D10/77 |
| 5,159,272 A | 10/1992 | Rao et al. | 324/429 |
| 5,160,881 A | 11/1992 | Schramm et al. | 322/7 |
| 5,164,653 A | 11/1992 | Reem | |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,187,381 A | 2/1993 | Iwasa et al. | 307/10.1 |
| 5,187,382 A | 2/1993 | Kondo | |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,223,787 A | 6/1993 | Tschulena | 257/713 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,309,052 A | 5/1994 | Kim | 74/350 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,345,384 A | 9/1994 | Przybyla et al. | 701/29.1 |
| 5,347,163 A | 9/1994 | Yoshimura | 307/66 |
| 5,349,535 A | 9/1994 | Gupta | 320/106 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,384,540 A | 1/1995 | Dessel | 324/539 |
| 5,387,871 A | 2/1995 | Tsai | 324/429 |
| 5,394,093 A | 2/1995 | Cervas | 324/556 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 429/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,462,439 A | 10/1995 | Keith | 180/279 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,631,536 A | 5/1997 | Tseng | 320/15 |
| 5,631,831 A | 5/1997 | Bird et al. | 701/34.4 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,644,212 A | 7/1997 | Takahashi | 320/134 |
| 5,650,937 A | 7/1997 | Bounaga | 702/65 |

(56) References Cited

U.S. PATENT DOCUMENTS

| | | | |
|---|---|---|---|
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,685,734 A | 11/1997 | Kutz | 439/371 |
| 5,691,621 A | 11/1997 | Phuoc et al. | 320/134 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,712,795 A | 1/1998 | Layman et al. | 700/297 |
| 5,717,336 A | 2/1998 | Basell et al. | 324/430 |
| 5,717,937 A | 2/1998 | Fritz | 713/300 |
| 5,721,688 A | 2/1998 | Bramwell | 324/426 |
| 5,732,074 A | 3/1998 | Spaur et al. | 370/313 |
| 5,739,667 A | 4/1998 | Matsuda et al. | 320/128 |
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,962 A | 6/1998 | Nor | 20/134 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,201 A | 10/1998 | Stockstad et al. | 320/119 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A * | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,869,951 A | 2/1999 | Takahashi | 320/104 |
| 5,870,018 A | 2/1999 | Person | 307/10.2 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,884,202 A | 3/1999 | Arjomand | 701/31.4 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,916,287 A | 6/1999 | Arjomand et al. | 701/33.2 |
| 5,927,938 A | 7/1999 | Hammerslag | 414/809 |
| 5,929,609 A | 7/1999 | Joy et al. | 322/25 |
| 5,935,180 A | 8/1999 | Fieramosca et al. | 701/29.6 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,950,144 A | 9/1999 | Hall et al. | 702/108 |
| 5,951,229 A | 9/1999 | Hammerslag | 414/398 |
| 5,953,322 A | 9/1999 | Kimball | 370/328 |
| 5,955,951 A | 9/1999 | Wischerop et al. | 340/572.8 |
| 5,961,561 A | 10/1999 | Wakefield, II | 701/29 |
| 5,961,604 A | 10/1999 | Anderson et al. | 709/229 |
| 5,963,012 A | 10/1999 | Garcia et al. | 320/106 |
| 5,969,625 A | 10/1999 | Russo | 340/636.19 |
| 5,973,598 A | 10/1999 | Beigel | 340/572.1 |
| 5,978,805 A | 11/1999 | Carson | 707/10 |
| 5,982,138 A | 11/1999 | Krieger | 320/105 |
| 5,990,664 A | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,081,154 A * | 6/2000 | Ezell et al. | 327/540 |
| 6,087,815 A | 7/2000 | Pfeifer et al. | 323/282 |
| 6,088,652 A | 7/2000 | Abe | 324/434 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,121,880 A * | 9/2000 | Scott et al. | 340/572.5 |
| 6,136,914 A | 10/2000 | Hergenrother et al. | 524/495 |
| 6,137,269 A | 10/2000 | Champlin | 320/150 |
| 6,140,797 A | 10/2000 | Dunn | 320/105 |
| 6,141,608 A | 10/2000 | Rother | 701/29.6 |
| 6,144,185 A | 11/2000 | Dougherty et al. | 320/132 |
| 6,147,598 A | 11/2000 | Murphy et al. | 340/426.19 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,181,545 B1 | 1/2001 | Amatucci et al. | 361/502 |
| 6,184,656 B1 | 2/2001 | Karunasiri et al. | 320/119 |
| 6,191,557 B1 | 2/2001 | Gray et al. | 320/132 |
| 6,202,739 B1 | 3/2001 | Pal et al. | 165/104.33 |
| 6,211,651 B1 | 4/2001 | Nemoto | 320/133 |
| 6,211,653 B1 | 4/2001 | Stasko | 320/132 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,225,898 B1 | 5/2001 | Kamiya et al. | 340/505 |
| 6,236,186 B1 | 5/2001 | Helton et al. | 320/106 |
| 6,236,332 B1 | 5/2001 | Conkright et al. | 340/3.1 |
| 6,236,949 B1 | 5/2001 | Hart | 702/64 |
| 6,238,253 B1 | 5/2001 | Qualls | 439/759 |

(56) References Cited

U.S. PATENT DOCUMENTS

| | | | |
|---|---|---|---|
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,255,826 B1 | 7/2001 | Ohsawa | 320/116 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,262,692 B1 * | 7/2001 | Babb | 343/895 |
| 6,263,268 B1 | 7/2001 | Nathanson | 701/29 |
| 6,263,322 B1 | 7/2001 | Kirkevold et al. | 705/400 |
| 6,271,643 B1 | 8/2001 | Becker et al. | 320/112 |
| 6,271,748 B1 | 8/2001 | Derbyshire et al. | 340/442 |
| 6,272,387 B1 | 8/2001 | Yoon | 700/83 |
| 6,275,008 B1 | 8/2001 | Arai et al. | 320/132 |
| 6,285,191 B1 | 9/2001 | Gollomp et al. | 324/427 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,320,351 B1 | 11/2001 | Ng et al. | 320/104 |
| 6,323,650 B1 | 11/2001 | Bertness et al. | 324/426 |
| 6,324,042 B1 | 11/2001 | Andrews | 361/93.2 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,356,083 B1 | 3/2002 | Ying | 324/426 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,363,790 B1 | 4/2002 | Flogel et al. | 701/31.5 |
| 6,377,031 B1 | 4/2002 | Karuppana et al. | 323/220 |
| 6,384,608 B1 | 5/2002 | Namaky | 324/430 |
| 6,388,448 B1 | 5/2002 | Cervas | 324/426 |
| 6,389,337 B1 | 5/2002 | Kolls | 701/31.6 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,433,512 B1 | 8/2002 | Birkler et al. | 320/132 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,448,778 B1 | 9/2002 | Rankin | 324/503 |
| 6,449,726 B1 | 9/2002 | Smith | 713/340 |
| 6,456,036 B1 | 9/2002 | Thandiwe | 320/106 |
| 6,456,045 B1 * | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,473,659 B1 | 10/2002 | Shah et al. | 700/79 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,501,243 B1 | 12/2002 | Kaneko | 318/139 |
| 6,505,507 B1 | 1/2003 | Imao et al. | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,848 B1 | 3/2003 | Chitsazan et al. | 320/153 |
| 6,532,425 B1 | 3/2003 | Boost et al. | 702/63 |
| 6,533,316 B2 | 3/2003 | Breed et al. | 280/735 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 324/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/10.7 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,732,031 B1 | 5/2004 | Lowrey et al. | 701/31.4 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness et al. | 324/426 |
| 6,771,073 B2 | 8/2004 | Henningson et al. | 324/426 |
| 6,777,945 B2 | 8/2004 | Roberts et al. | 324/426 |
| 6,781,344 B1 | 8/2004 | Hedegor et al. | 320/106 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,832,141 B2 | 12/2004 | Skeen et al. | 701/31.4 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,856,162 B1 | 2/2005 | Greatorex et al. | 324/764.01 |
| 6,856,972 B1 | 2/2005 | Yun et al. | 705/36 R |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,911,825 B2 | 6/2005 | Namaky | 324/426 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,957,133 B1 | 10/2005 | Hunt et al. | 701/32.4 |
| 6,967,484 B2 | 11/2005 | Bertness | 324/426 |
| 6,972,662 B1 | 12/2005 | Ohkawa et al. | 340/10.1 |
| 6,983,212 B2 * | 1/2006 | Burns | 702/63 |
| 6,988,053 B2 | 1/2006 | Namaky | 320/104 |
| 6,993,421 B2 | 1/2006 | Pillar et al. | 701/29.4 |

(56) References Cited

U.S. PATENT DOCUMENTS

| | | | |
|---|---|---|---|
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,015,674 B2 | 3/2006 | VonderHaar | 320/103 |
| 7,029,338 B1 | 4/2006 | Orange et al. | 439/755 |
| 7,034,541 B2 | 4/2006 | Bertness et al. | 324/426 |
| 7,039,533 B2 | 5/2006 | Bertness et al. | 702/63 |
| 7,042,346 B2* | 5/2006 | Paulsen | 340/438 |
| 7,049,822 B2 | 5/2006 | Kung | 324/426 |
| 7,058,525 B2 | 6/2006 | Bertness et al. | 702/63 |
| 7,069,979 B2 | 7/2006 | Tobias | 165/104.33 |
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,170,393 B2* | 1/2007 | Martin | 340/10.1 |
| 7,173,182 B2 | 2/2007 | Katsuyama | 174/36 |
| 7,177,925 B2 | 2/2007 | Carcido et al. | 709/223 |
| 7,182,147 B2 | 2/2007 | Cutler et al. | 173/1 |
| 7,184,866 B2 | 2/2007 | Squires | 340/426.15 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,202,636 B2* | 4/2007 | Reynolds et al. | 320/166 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/183 |
| 7,212,887 B2 | 5/2007 | Shah et al | 700/276 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,251,551 B2 | 7/2007 | Mitsueda | 700/2 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 702/63 |
| 7,376,497 B2 | 5/2008 | Chen | 701/31.6 |
| 7,398,176 B2 | 7/2008 | Bertness | 702/140 |
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,505,856 B2 | 3/2009 | Restaino et al. | 702/63 |
| 7,545,146 B2 | 6/2009 | Klang et al. | 324/426 |
| 7,557,586 B1 | 7/2009 | Vonderhaar et al. | 324/426 |
| 7,590,476 B2 | 9/2009 | Shumate | 701/31.6 |
| 7,592,776 B2 | 9/2009 | Tsukamoto et al. | 320/136 |
| 7,595,643 B2 | 9/2009 | Klang | 324/426 |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 | 2/2010 | Thibedeau et al. | 702/63 |
| 7,667,437 B2 | 2/2010 | Johnson et al. | 320/150 |
| 7,679,325 B2 | 3/2010 | Seo | 20/116 |
| 7,684,908 B1 | 3/2010 | Ogilvie et al. | 701/29.6 |
| 7,688,074 B2 | 3/2010 | Cox et al. | 324/426 |
| 7,698,179 B2 | 4/2010 | Leung et al. | 705/28 |
| 7,705,602 B2 | 4/2010 | Bertness | 324/426 |
| 7,706,991 B2 | 4/2010 | Bertness et al. | 702/63 |
| 7,710,119 B2 | 5/2010 | Bertness | 324/426 |
| 7,723,993 B2 | 5/2010 | Klang | 324/431 |
| 7,728,556 B2 | 6/2010 | Yano et al. | 320/134 |
| 7,728,597 B2 | 6/2010 | Bertness | 324/426 |
| 7,743,788 B2 | 6/2010 | Schmitt | 137/554 |
| 7,751,953 B2 | 7/2010 | Namaky | 701/33.2 |
| 7,772,850 B2 | 8/2010 | Bertness | 324/426 |
| 7,774,130 B2 | 8/2010 | Pepper | 340/439 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,808,375 B2 | 10/2010 | Bertness et al. | 340/455 |
| 7,848,857 B2 | 12/2010 | Nasr et al. | 701/22 |
| 7,883,002 B2 | 2/2011 | Jin et al. | 235/376 |
| 7,902,990 B2 | 3/2011 | Delmonico et al. | 340/636.1 |
| 7,924,015 B2 | 4/2011 | Bertness | 324/427 |
| 7,940,053 B2 | 5/2011 | Brown et al. | 324/426 |
| 7,990,155 B2 | 8/2011 | Henningson | 324/429 |
| 7,999,505 B2 | 8/2011 | Bertness | 320/104 |
| 8,024,083 B2 | 9/2011 | Chenn | 701/2 |
| 8,164,343 B2 | 4/2012 | Bertness | 324/503 |
| 8,222,868 B2 | 7/2012 | Buckner | 320/136 |
| 8,306,690 B2 | 11/2012 | Bertness | 701/34.4 |
| 8,449,560 B2 | 5/2013 | Roth | 227/175.1 |
| 8,594,957 B2 | 11/2013 | Gauthier | 324/548 |
| 8,827,729 B2 | 9/2014 | Gunreben | 439/188 |
| 9,037,394 B2 | 5/2015 | Fernandes | 701/400 |
| 2001/0012738 A1 | 8/2001 | Duperret et al. | 439/835 |
| 2001/0035737 A1 | 11/2001 | Nakanishi et al. | 320/122 |
| 2001/0048215 A1 | 12/2001 | Breed et al. | 280/728.1 |
| 2001/0048226 A1 | 12/2001 | Nada | 290/40 |
| 2002/0003423 A1 | 1/2002 | Bertness et al. | 324/426 |
| 2002/0004694 A1 | 1/2002 | McLeod et al. | 701/29 |
| 2002/0007237 A1 | 1/2002 | Phung et al. | 701/33 |
| 2002/0010558 A1 | 1/2002 | Bertness et al. | 702/63 |
| 2002/0021135 A1 | 2/2002 | Li et al. | 324/677 |
| 2002/0027346 A1 | 3/2002 | Breed et al. | 280/735 |
| 2002/0030495 A1 | 3/2002 | Kechmire | 324/427 |
| 2002/0036504 A1 | 3/2002 | Troy et al. | 324/430 |
| 2002/0041175 A1 | 4/2002 | Lauper et al. | 320/106 |
| 2002/0044050 A1 | 4/2002 | Derbyshire et al. | 340/442 |
| 2002/0047711 A1 | 4/2002 | Bertness et al. | 324/426 |
| 2002/0050163 A1 | 5/2002 | Makhija et al. | 73/116 |
| 2002/0074398 A1 | 6/2002 | Lancos et al. | 235/382 |
| 2002/0116140 A1 | 8/2002 | Rider | 702/63 |
| 2002/0118111 A1 | 8/2002 | Brown et al. | 340/573.1 |
| 2002/0121901 A1 | 9/2002 | Hoffman | 324/426 |
| 2002/0128985 A1 | 9/2002 | Greenwald | 705/400 |
| 2002/0130665 A1 | 9/2002 | Bertness et al. | 324/426 |
| 2002/0171428 A1 | 11/2002 | Bertness | 702/63 |
| 2002/0176010 A1 | 11/2002 | Wallach et al. | 348/362 |
| 2003/0006779 A1 | 1/2003 | Youval | 324/503 |
| 2003/0009270 A1 | 1/2003 | Breed | 701/29 |
| 2003/0017753 A1 | 1/2003 | Palmisano et al. | 439/762 |
| 2003/0025481 A1 | 2/2003 | Bertness | 324/427 |
| 2003/0036909 A1 | 2/2003 | Kato | 704/275 |
| 2003/0040873 A1 | 2/2003 | Lesesky et al. | 702/57 |
| 2003/0060953 A1 | 3/2003 | Chen | 701/33 |
| 2003/0078743 A1 | 4/2003 | Bertness et al. | 702/63 |
| 2003/0088375 A1 | 5/2003 | Bertness et al. | 702/63 |
| 2003/0124417 A1 | 7/2003 | Bertness et al. | 429/90 |
| 2003/0128011 A1 | 7/2003 | Bertness et al. | |
| 2003/0128036 A1 | 7/2003 | Henningson et al. | 324/426 |
| 2003/0137277 A1 | 7/2003 | Mori et al. | 320/132 |
| 2003/0169018 A1 | 9/2003 | Berels et al. | 320/132 |
| 2003/0169019 A1 | 9/2003 | Oosaki | 320/132 |
| 2003/0171111 A1 | 9/2003 | Clark | 455/414.1 |
| 2003/0177417 A1 | 9/2003 | Malhotra et al. | 714/42 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2003/0236656 A1* | 12/2003 | Dougherty | 703/14 |
| 2004/0000590 A1 | 1/2004 | Raichle et al. | 235/462.01 |

(56) References Cited

U.S. PATENT DOCUMENTS

| | | | |
|---|---|---|---|
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0036443 A1 | 2/2004 | Bertness | 320/109 |
| 2004/0044452 A1 | 3/2004 | Bauer et al. | 703/33 |
| 2004/0044454 A1 | 3/2004 | Ross et al. | 701/33 |
| 2004/0049361 A1 | 3/2004 | Hamdan et al. | 702/115 |
| 2004/0051532 A1 | 3/2004 | Smith et al. | 324/426 |
| 2004/0051533 A1 | 3/2004 | Namaky | 324/426 |
| 2004/0051534 A1 | 3/2004 | Kobayashi et al. | 324/429 |
| 2004/0054503 A1 | 3/2004 | Namaky | 702/182 |
| 2004/0064225 A1 | 4/2004 | Jammu et al. | 701/29 |
| 2004/0065489 A1 | 4/2004 | Aberle | 180/65.1 |
| 2004/0088087 A1 | 5/2004 | Fukushima et al. | 701/32 |
| 2004/0113588 A1 | 6/2004 | Mikuriya et al. | 320/128 |
| 2004/0145342 A1* | 7/2004 | Lyon | 320/108 |
| 2004/0164706 A1 | 8/2004 | Osborne | 320/116 |
| 2004/0172177 A1 | 9/2004 | Nagai et al. | 701/29 |
| 2004/0178185 A1 | 9/2004 | Yoshikawa et al. | 219/270 |
| 2004/0189309 A1 | 9/2004 | Bertness et al. | 324/426 |
| 2004/0199343 A1 | 10/2004 | Cardinal et al. | 702/63 |
| 2004/0207367 A1 | 10/2004 | Taniguchi et al. | 320/149 |
| 2004/0221641 A1 | 11/2004 | Moritsugu | 73/23.31 |
| 2004/0227523 A1 | 11/2004 | Namaky | 324/537 |
| 2004/0239332 A1 | 12/2004 | Mackel et al. | 324/426 |
| 2004/0251876 A1 | 12/2004 | Bertness | 320/132 |
| 2004/0257084 A1 | 12/2004 | Restaino | 324/400 |
| 2005/0007068 A1 | 1/2005 | Johnson et al. | 320/110 |
| 2005/0009122 A1* | 1/2005 | Whelan et al. | 435/7.32 |
| 2005/0017726 A1 | 1/2005 | Koran et al. | 324/433 |
| 2005/0017952 A1 | 1/2005 | Hsi | 345/169 |
| 2005/0021197 A1 | 1/2005 | Zimmerman | 701/31.4 |
| 2005/0021294 A1 | 1/2005 | Trsar et al. | 702/183 |
| 2005/0025299 A1 | 2/2005 | Tischer et al. | 379/199 |
| 2005/0043868 A1 | 2/2005 | Mitcham | 701/29 |
| 2005/0057256 A1 | 3/2005 | Bertness | 324/426 |
| 2005/0060070 A1 | 3/2005 | Kapolka et al. | 701/29 |
| 2005/0073314 A1 | 4/2005 | Bertness et al. | 324/433 |
| 2005/0076381 A1* | 4/2005 | Gross | 725/107 |
| 2005/0096809 A1 | 5/2005 | Skeen et al. | 701/29 |
| 2005/0102073 A1 | 5/2005 | Ingram | 701/29 |
| 2005/0119809 A1 | 6/2005 | Chen | 701/33.5 |
| 2005/0128083 A1 | 6/2005 | Puzio et al. | 340/572.1 |
| 2005/0128902 A1 | 6/2005 | Tsai | 369/44.32 |
| 2005/0133245 A1 | 6/2005 | Katsuyama | 174/74 R |
| 2005/0134282 A1 | 6/2005 | Averbuch | 324/426 |
| 2005/0143882 A1 | 6/2005 | Umezawa | 701/29 |
| 2005/0159847 A1 | 7/2005 | Shah et al. | 700/276 |
| 2005/0162172 A1 | 7/2005 | Bertness | 324/426 |
| 2005/0168226 A1 | 8/2005 | Quint et al. | 324/426 |
| 2005/0173142 A1 | 8/2005 | Cutler et al. | 173/181 |
| 2005/0182536 A1 | 8/2005 | Doyle et al. | 701/29 |
| 2005/0212521 A1 | 9/2005 | Bertness et al. | 324/426 |
| 2005/0213874 A1 | 9/2005 | Kline | 385/15 |
| 2005/0218902 A1 | 10/2005 | Restaino et al. | 324/433 |
| 2005/0231205 A1 | 10/2005 | Bertness et al. | 324/426 |
| 2005/0254106 A9 | 11/2005 | Silverbrook et al. | 358/539 |
| 2005/0256617 A1 | 11/2005 | Cawthorne et al. | 701/22 |
| 2005/0258241 A1 | 11/2005 | McNutt et al. | 235/385 |
| 2005/0269880 A1 | 12/2005 | Konishi | 307/10.7 |
| 2005/0273218 A1 | 12/2005 | Breed | 701/2 |
| 2006/0012330 A1 | 1/2006 | Okumura et al. | 320/103 |
| 2006/0017447 A1 | 1/2006 | Bertness | 324/537 |
| 2006/0026017 A1 | 2/2006 | Walker | 701/31.4 |
| 2006/0030980 A1 | 2/2006 | St. Denis | 701/29 |
| 2006/0043976 A1 | 3/2006 | Gervais | 324/508 |
| 2006/0079203 A1 | 4/2006 | Nicolini | 455/411 |
| 2006/0089767 A1 | 4/2006 | Sowa | 701/29 |
| 2006/0095230 A1 | 5/2006 | Grier et al. | 702/183 |
| 2006/0102397 A1 | 5/2006 | Buck | 429/432 |
| 2006/0152224 A1 | 7/2006 | Kim et al. | 324/430 |
| 2006/0155439 A1 | 7/2006 | Slawinski | 701/33.4 |
| 2006/0161313 A1 | 7/2006 | Rogers et al. | 701/1 |
| 2006/0161390 A1 | 7/2006 | Namaky et al. | 702/183 |
| 2006/0217914 A1 | 9/2006 | Bertness | 702/113 |
| 2006/0244457 A1 | 11/2006 | Henningson et al. | 324/426 |
| 2006/0282323 A1 | 12/2006 | Walker et al. | 705/14 |
| 2007/0005201 A1 | 1/2007 | Chenn | 701/31.5 |
| 2007/0024460 A1 | 2/2007 | Clark | 340/663 |
| 2007/0026916 A1 | 2/2007 | Juds et al. | 463/1 |
| 2007/0046261 A1 | 3/2007 | Porebski | 320/132 |
| 2007/0088472 A1 | 4/2007 | Ganzhorn et al. | 701/33 |
| 2007/0108942 A1 | 5/2007 | Johnson et al. | 320/112 |
| 2007/0159177 A1 | 7/2007 | Bertness et al. | 324/426 |
| 2007/0182576 A1* | 8/2007 | Proska et al. | 340/636.1 |
| 2007/0194791 A1 | 8/2007 | Huang | 324/430 |
| 2007/0194793 A1 | 8/2007 | Bertness | 324/503 |
| 2007/0205983 A1 | 9/2007 | Naimo | 345/160 |
| 2007/0259256 A1 | 11/2007 | Le Canut et al. | 429/90 |
| 2008/0036421 A1 | 2/2008 | Seo | 320/132 |
| 2008/0059014 A1 | 3/2008 | Nasr et al. | 701/22 |
| 2008/0064559 A1 | 3/2008 | Cawthorne | 477/5 |
| 2008/0086246 A1 | 4/2008 | Bolt et al. | 701/29 |
| 2008/0094068 A1 | 4/2008 | Scott | 324/426 |
| 2008/0103656 A1 | 5/2008 | Lipscomb | 701/33.4 |
| 2008/0169818 A1 | 7/2008 | Lesesky et al. | 324/426 |
| 2008/0179122 A1 | 7/2008 | Sugawara | 180/65.245 |
| 2008/0303528 A1 | 12/2008 | Kim | 324/430 |
| 2008/0303529 A1 | 12/2008 | Nakamura et al. | 324/433 |
| 2008/0315830 A1 | 12/2008 | Bertness | 320/104 |
| 2009/0006476 A1 | 1/2009 | Andreasen et al. | 707/104.1 |
| 2009/0024266 A1 | 1/2009 | Bertness | 701/22 |
| 2009/0024419 A1 | 1/2009 | McClellan | 705/4 |
| 2009/0085571 A1 | 4/2009 | Bertness | 324/426 |
| 2009/0146800 A1 | 6/2009 | Grimlund et al. | 340/505 |
| 2009/0198372 A1 | 8/2009 | Hammerslag | 700/226 |
| 2009/0203247 A1 | 8/2009 | Fifelski | 439/345 |
| 2009/0247020 A1 | 10/2009 | Gathman et al. | 439/759 |
| 2009/0265121 A1 | 10/2009 | Rocci | 702/57 |
| 2009/0276115 A1 | 11/2009 | Chen | 701/32 |
| 2010/0023198 A1 | 1/2010 | Hamilton | 701/29 |
| 2010/0066283 A1 | 3/2010 | Kitanaka | 318/400.02 |
| 2010/0145780 A1 | 6/2010 | Nishikawa et al. | 705/14.11 |
| 2010/0214055 A1 | 8/2010 | Fuji | 340/3.1 |
| 2010/0314950 A1 | 12/2010 | Rutkowski et al. | 307/125 |
| 2011/0004427 A1 | 1/2011 | Gorbold et al. | 702/63 |
| 2011/0015815 A1 | 1/2011 | Bertness | 701/22 |
| 2011/0215767 A1 | 9/2011 | Johnson et al. | 320/136 |
| 2011/0273181 A1 | 11/2011 | Park et al. | 324/429 |
| 2012/0046824 A1 | 2/2012 | Ruther et al. | 701/31.5 |
| 2012/0062237 A1 | 3/2012 | Robinson | 324/433 |
| 2012/0074904 A1 | 3/2012 | Rutkowski et al. | 320/112 |
| 2012/0116391 A1 | 5/2012 | Houser | 606/41 |
| 2012/0249069 A1 | 10/2012 | Ohtomo | 320/109 |
| 2012/0256494 A1 | 10/2012 | Kesler | 307/104 |
| 2012/0256568 A1 | 10/2012 | Lee | 318/139 |
| 2013/0158782 A1 | 6/2013 | Bertness et al. | 701/34.4 |
| 2013/0311124 A1 | 11/2013 | Van Bremen | 702/104 |
| 2014/0002094 A1 | 1/2014 | Champlin | 324/426 |

FOREIGN PATENT DOCUMENTS

| | | |
|---|---|---|
| DE | 29 26 716 B1 | 1/1981 |
| DE | 196 38 324 | 9/1996 |
| DE | 10 2008 036 5 | 2/2010 |
| EP | 0 022 450 A1 | 1/1981 |
| EP | 0 391 694 A2 | 4/1990 |
| EP | 0 476 405 A1 | 9/1991 |
| EP | 0 637 754 A1 | 2/1995 |
| EP | 0 772 056 A1 | 5/1997 |
| EP | 0 982 159 A2 | 3/2000 |
| EP | 1 810 869 A1 | 11/2004 |
| EP | 1 807 710 B1 | 7/2007 |
| EP | 1 807 710 | 1/2010 |
| FR | 749 397 | 12/1997 |
| GB | 154 016 | 11/1920 |
| GB | 2 029 586 | 3/1980 |
| GB | 2 088 159 A | 6/1982 |
| GB | 2 246 916 A | 10/1990 |

(56) References Cited

FOREIGN PATENT DOCUMENTS

| | | |
|---|---|---|
| GB | 2 275 783 A | 7/1994 |
| GB | 2 387 235 A | 10/2003 |
| JP | 59-17892 | 1/1984 |
| JP | 59-17893 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| JP | 11-271409 | 10/1999 |
| JP | 2001057711 A | 2/2001 |
| JP | 2003-346909 | 12/2003 |
| JP | 2006331976 A | 12/2006 |
| JP | 2009-244166 | 10/2009 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | 98/21132 | 5/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |
| WO | WO 2010/007681 | 1/2010 |
| WO | WO 2011/153419 | 12/2011 |
| WO | WO 2012/078921 | 6/2012 |

OTHER PUBLICATIONS

"Electrochemical Impedance Spectroscopy in Battery Development and Testing", Batteries International, Apr. 1997, pp. 59 and 62-63.
"Battery Impedance", by E. Willihnganz et al., Electrical Engineering, Sep. 1959, pp. 922-925.
"Determining The End of Battery Life", by S. DeBardelaben, IEEE, 1986, pp. 365-368.
"A Look at the Impedance of a Cell", by S. Debardelaben, IEEE, 1988, pp. 394-397.
"The Impedance of Electrical Storage Cells", by N.A. Hampson et al., Journal of Applied Electrochemistry, 1980, pp. 3-11.
"A Package for Impedance/Admittance Data Analysis", by B. Boukamp, Solid State Ionics, 1986, pp. 136-140.
"Precision of Impedance Spectroscopy Estimates of Bulk, Reaction Rate, and Diffusion Parameters", by J. Macdonald et al., J. Electroanal, Chem., 1991, pp. 1-11.

Internal Resistance: Harbinger of Capacity Loss in Starved Electrolyte Sealed Lead Acid Batteries, by Vaccaro, F.J. et al., At&T Bell Laboratories, 1987 IEEE, 2477, pp. 128,131.
IEEE Recommended Practice for Maintenance, Testings, and Replacement of Large Lead Storage Batteries for Generating Stations and Substations, The Institute of Electrical and Electronics Engineers, Inc., ANSI/IEEE Std. 450-1987, Mar. 9, 1987, pp. 7-15.
"Field and Laboratory Studies to assess the State of Health of Valve-Regulated Lead Acid Batteries: Part I Conductance/Capacity Correlation Studies", by D. Feder et al., IEEE, Aug. 1992, pp. 218-233.
"JIS Japanese Industrial Standard-Lead Acid Batteries for Automobiles", Japanese Standards Association UDC, 621.355.2:629.113. 006, Nov. 1995.
"Performance of Dry Cells", by C. Hambuechen, Preprint of Am. Electrochem. Soc., Apr. 18-20, 1912, paper No. 19, pp. 1-5.
"A Bridge for Measuring Storage Battery Resistance", by E. Willihncanz, The Electrochemical Society, preprint 79-20, Apr. 1941, pp. 253-258.
National Semiconductor Corporation, "High Q Notch Filter", 3/69, Linear Brief 5, Mar. 1969.
Burr-Brown Corporation, "Design a 60 Hz Notch Filter with the UAF42", 1/94, AB-071, 1994.
National Semiconductor Corporation, "LMF90-$4^{th}$ -Order Elliptic Notch Filter", 12/94, RRD-B30M115, Dec. 1994.
"Alligator Clips with Wire Penetrators" J.S. Popper, Inc. product information, downloaded from http://www.jspopper.com/, prior to Oct. 1, 2002.
"#12: LM78S40 Simple Switcher DC to DC Converter", ITM e-Catalog, downloaded from http://www.pcbcafe.corn, prior to Oct. 1, 2002.
"Simple DC-DC Converts Allows Use of Single Battery", Electronix Express, downloaded from http://wwwelexp.com/t_dc-dc.htm, prior to Oct. 1, 2002.
"DC-DC Converter Basics", Power Designers, downloaded from http://www.powederdesigners.com/InfoWeb.design_center/articles/DC-DC/converter.shtm, prior to Oct. 1, 2002.
"Notification of Transmittal of the International Search Report or the Declaration", PCT/US02/29461, filed Sep. 17, 2002 and mailed Jan. 3, 2003.
"Notification of Transmittal of the International Search Report or the Declaration", PCT/US03/07546, filed Mar. 13, 2003 and mailed Jul. 4, 2001.
"Notification of Transmittal of the International Search Report or the Declaration", PCT/US03/06577, filed Mar. 5, 2003 and mailed Jul. 24, 2003.
"Notification of Transmittal of the International Search Report or the Declaration", PCT/US03/07837, filed Mar. 14, 2003 and mailed Jul. 4, 2003.
"Improved Impedance Spectroscopy Technique for Status Determination of Production Li/$SO_2$ Batteries" Terrill Atwater et al., pp. 10-113, (1992).
"Notification of Transmittal of the International Search Report or the Declaration", PCT/US03/41561; Search Report completed Apr. 13, 2004, mailed May 6, 2004.
"Notification of Transmittal of the International Search Report or the Declaration", PCT/US03/27696, filed Sep. 4, 2003 and mailed Apr. 15, 2004.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois pp. 1-1-14-13, (1991).
Supplementary European Search Report Communication for Appl. No. 99917402.2; Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707, filed Sep. 30, 2003 and mailed Nov. 24, 2004.

(56) References Cited

OTHER PUBLICATIONS

"A review of impedance measurements for determination of the state-of-charge or state-of-health of secondary batteries", Journal of Power Sources, pp. 59-69, (1998).
"Search Report Under Section 17" for Great Britain Application No. GB0421447.4, date of search Jan. 27, 2005, date of document Jan. 28, 2005.
"Results of Discrete Frequency Immittance Spectroscopy (DFIS) Measurements of Lead Acid Batteries", by K.S. Champlin et al., *Proceedings of 23rd International Teleco Conference (INTELEC)*, published Oct. 2001, IEE, pp. 433-440.
"Examination Report" from the UK Patent Office for App. No. 0417678.0; Jan. 24, 2005.
Wikipedia Online Encyclopedia, Inductance, 2005, http://en.wikipedia.org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, Sand Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.
Notification of Transmittal of the International Search Report and the Written Opinion of the International *Searching* Authority, or the Declaration for PCT/US2011/038279 filed May 27, 2011, date of mailing Sep. 16, 2011, 12 pages.
U.S. Appl. No. 60/387,912, filed Jun. 13, 2002 which is related to U.S. Pat. No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I-Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II-Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).

"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™ /DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et la., Mar. 2000, 6 pgs; (10 total pgs.).
Search Report and Written Opinion from PCT Application No. PCT/US2011/026608, dated Aug. 29, 2011, 9 pgs.
Examination Report under section 18(3) for corresponding Great Britain Application No. GB1000773.0, dated Feb. 6, 2012, 2 pages.
First Office Action (with English translation) for Chinese Application No. 200810190887.X, issued May 3, 2012, 12 pages.
Office Actions for corresponding U.S. Appl. No. 11/207,419, 55 pages.
Office Actions for corresponding U.S. Appl. No. 12/416,445, 23 pages.
Office Actions for corresponding U.S. Appl. No. 12/416,453, 26 pages.
Office Actions for corresponding U.S. Appl. No. 12/416,457, 22 pages.
Communication from GB1216105.5, dated Sep. 21, 2012, 4 pages.
Notification of Transmittal of the International Search Report and Written Opinion from PCT/US2011/039043, dated Jul. 26, 2012, 9 pages.
Notification of Transmittal of the International Search Report and Written Opinion from PCT/US2011/053886, dated Jul. 27, 2012, 11 pages.
"Field Evaluation of Honda's EV Plus Battery Packs", by A. Paryani, *IEEE AES Systems Magazine*, Nov. 2000, pp. 21-24.
Search Report for PCT/US2011/047354, dated Nov. 11, 2011, 4 pages.
Written Opinion for PCT/US2011/047354, dated Nov. 11, 2011, 7 pages.
Office Action from U.S. Appl. No. 12/416,453, dated Jan. 14, 2013.
First Office Action (Notification of Reasons for Rejections) dated Dec. 3, 2013 in related Japanese patent application No. 2013-513370, 9 pgs. Including English Translation.
Official Action dated Jan. 22, 2014 in Korean patent application No. 10-2012-7033020, 2 pgs. including English Translation.
Official Action dated Feb. 20, 2014 in Korean patent application No. 10-2013-7004814, 6 pgs. including English Translation.
First Office Action for Chinese Patent Application No. 201180011597.4, dated May 6, 2014, 20 pages.
Office Action from Korean Application No. 10-2012-7033020, dated Jul. 29, 2014.
Office Action for Chinese Patent Application No. 201180038844.X, dated Jul. 1, 2014.
Office Action for Chinese Patent Application No. 201180030045.8, dated Jul. 21, 2014.
Office Action for German Patent Application No. 1120111030643 dated Aug. 28, 2014.

(56) References Cited

OTHER PUBLICATIONS

Office Action from Japanese Patent Application No. 2013-513370, dated Aug. 5, 2014.
Office Action from Japanese Patent Application No. 2013-531839, dated Jul. 8, 2014.
Office Action for German Patent Application No. 103 32 625.1, dated Nov. 7, 2014, 14 pages.
Office Action from Chinese Patent Application No. 201180038844.X, dated Dec. 8, 2014.
Office Action from CN Application No. 201180011597.4, dated Jan. 6, 2015.
Office Action for Chinese Patent Application No. 201180030045.8, dated Mar. 24, 2015.
Office Action for Japanese Patent Application No. 2013-531839, dated Mar. 31, 2015.
Notification of Transmittal of the International Search Report and Written Opinion from PCT/US2014/069661, dated Mar. 26, 2015.
Office Action for Chinese Patent Application No. 201180038844.X, dated Jun. 8, 2015.
Office Action from Chinese Patent Application No. 201180011597.4 dated Jun. 3, 2015.
European Search Report from European Application No. EP 15151426.2, dated Jun. 1, 2015.

\* cited by examiner

SYSTEM FOR AUTOMATICALLY GATHERING BATTERY INFORMATION

CROSS REFERENCE TO RELATED APPLICATIONS

The present application is a Continuation-in-Part and claims priority of U.S. Ser. No. 12/416,457, filed Apr. 1, 2009, which is a Continuation-In-Part of and claims priority of U.S. patent application Ser. No. 11/207,419, filed Aug. 19, 2005, which is based on and claims the benefit of U.S. provisional patent application Ser. No. 60/603,078, filed Aug. 20, 2004; the present application is also a Continuation-in-Part and claims priority of U.S. Ser. No. 12/416,453, filed Apr. 1, 2009, which is a Continuation-In-Part of and claims priority of U.S. patent application Ser. No. 11/207,419, filed Aug. 19, 2005, which is based on and claims the benefit of U.S. provisional patent application Ser. No. 60/603,078, filed Aug. 20, 2004; the present invention is also a Continuation-in-Part and claims priority of U.S. Ser. No. 12/416,445, filed Apr. 1, 2009, which is a Continuation-In-Part of and claims priority of U.S. patent application Ser. No. 11/207,419, filed Aug. 19, 2005, which is based on and claims the benefit of U.S. provisional patent application Ser. No. 60/603,078, filed Aug. 20, 2004, the contents of which are hereby incorporated by reference in their entirety.

BACKGROUND OF THE INVENTION

The present invention relates to storage batteries. More specifically, the present invention relates to a system for automatically gathering battery information for use during battery testing/charging.

Storage batteries, such as lead acid storage batteries, are used in a variety of applications such as automotive vehicles and stand by power sources. Typically, storage batteries consist of a plurality of individual storage cells which are electrically connected in series. Each cell can have a voltage potential of about 2.1 volts, for example. By connecting the cells in series, the voltages of individual cells are added in a cumulative manner. For example, in a typical automotive battery, six storage cells are used to provide a total voltage of 12.6 volts. The individual cells are held in a housing and the entire assembly is commonly referred to as the "battery."

It is frequently desirable to ascertain the condition of a storage battery. Various testing techniques have been developed over the long history of storage batteries. For example, one technique involves the use of a hygrometer in which the specific gravity of the acid mixture in the battery is measured. Electrical testing has also been used to provide less invasive battery testing techniques. A very simple electrical test is to simply measure the voltage across the battery. If the voltage is below a certain threshold, the battery is determined to be bad. Another technique for testing a battery is referred to as a load test. In the load test, the battery is discharged using a known load. As the battery is discharged, the voltage across the battery is monitored and used to determine the condition of the battery. More recently, techniques have been pioneered by Dr. Keith S. Champlin and Midtronics, Inc. of Willowbrook, Ill. for testing storage batteries by measuring a dynamic parameter of the battery such as the dynamic conductance of the battery. This technique is described in a number of United States patents and United States patent applications, for example U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. No. 6,456,045; U.S. Pat. No. 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Pat. No. 7,924,015, issued Apr. 12, 2011; U.S. Pat. No. 7,940,053, issued May 10, 2011; U.S. Pat. No. 7,940,052, issued May 10, 2011; U.S. Pat. No. 7,959,476, issued Jun. 14, 2011; U.S. Pat. No. 7,977,914, issued Jul. 12, 2011; U.S. Pat. No. 7,999,505, issued Aug. 16, 2011; U.S. Pat. No. D643,759, issued Aug. 23, 2011; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 10/791,141, filed Mar. 2, 2004, entitled METHOD AND APPARATUS FOR AUDITING A BATTERY TEST; U.S. Ser. No. 10/867,385, filed Jun. 14, 2004, entitled ENERGY MANAGEMENT SYSTEM FOR AUTOMOTIVE VEHICLE; U.S. Ser. No. 10/958,812, filed Oct. 5, 2004, entitled SCAN TOOL FOR ELECTRONIC BATTERY TESTER; U.S. Ser. No. 60/587,232, filed Dec. 14, 2004, entitled CELLTRON ULTRA, U.S. Ser. No. 60/653,537, filed Feb. 16, 2005, entitled CUSTOMER MANAGED WARRANTY CODE; U.S. Ser. No. 60/665,070, filed Mar. 24, 2005, entitled OHMMETER PROTECTION CIRCUIT; U.S. Ser. No. 60,694,199, filed Jun. 27, 2005, entitled GEL BATTERY CONDUCTANCE COMPENSATION; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 11/304,004, filed Dec. 14, 2005, entitled BATTERY TESTER THAT CALCULATES ITS OWN REFERENCE VALUES; U.S. Ser. No. 60/751,853, filed Dec. 20, 2005, entitled BATTERY MONITORING SYSTEM; U.S. Ser. No. 11/304,004, filed Dec. 14, 2005, entitled BATTERY TESTER WITH CALCULATES ITS OWN REFERENCE VALUES; U.S. Ser. No. 60/751,853, filed Dec. 20, 2005, entitled BATTERY MONITORING SYSTEM; U.S. Ser. No. 11/356,443, filed Feb. 16, 2006, entitled ELECTRONIC BATTERY TESTER WITH NETWORK COMMUNICATION; U.S. Ser. No. 11/519,481, filed Sep. 12, 2006, entitled BROAD-BAND LOW-CONDUCTANCE CABLES FOR MAKING KELVIN CONNECTIONS TO ELECTROCHEMICAL CELLS AND BATTERIES; U.S. Ser. No. 60/847,064, filed Sep. 25, 2006, entitled STATIONARY BATTERY MONITORING ALGORITHMS; U.S. Ser. No. 11/641,594, filed Dec. 19, 2006, entitled METHOD AND APPARATUS FOR MEASURING A PARAMETER OF A VEHICLE ELECTRONIC SYSTEM; U.S. Ser. No. 60/950,182, filed Jul. 17, 2007, entitled BATTERY TESTER FOR HYBRID VEHICLE;

U.S. Ser. No. 60/973,879, filed Sep. 20, 2007, entitled ELECTRONIC BATTERY TESTER FOR TESTING STATIONARY BATTERIES; U.S. Ser. No. 60/992,798, filed Dec. 6, 2007, entitled STORAGE BATTERY AND BATTERY TESTER; U.S. Ser. No. 61/061,848, filed Jun. 16, 2008, entitled KELVIN CLAMP FOR ELECTRONICALLY COUPLING TO A BATTERY CONTACT; U.S. Ser. No. 12/168,264, filed Jul. 7, 2008, entitled BATTERY TESTERS WITH SECONDARY FUNCTIONALITY; U.S. Ser. No. 12/174,894, filed Jul. 17, 2008, entitled BATTERY TESTER FOR ELECTRIC VEHICLE; U.S. Ser. No. 12/204,141, filed Sep. 4, 2008, entitled ELECTRONIC BATTERY TESTER OR CHARGER WITH DATABUS CONNECTION; U.S. Ser. No. 12/328,022, filed Dec. 4, 2008, entitled STORAGE BATTERY AND BATTERY TESTER; U.S. Ser. No. 12/416,457, filed Apr. 1, 2009, entitled SYSTEM FOR AUTOMATICALLY GATHERING BATTERY INFORMATION; U.S. Ser. No. 12/416,453, filed Apr. 1, 2009, entitled INTEGRATED TAG READER AND ENVIRONMENT SENSOR; U.S. Ser. No. 12/416,445, filed Apr. 1, 2009, entitled SIMPLIFICATION OF INVENTORY MANAGEMENT; U.S. Ser. No. 12/498,642, filed Jul. 7, 2009, entitled ELECTRONIC BATTERY TESTER; U.S. Ser. No. 12/697,485, filed Feb. 1, 2010, entitled ELECTRONIC BATTERY TESTER; U.S. Ser. No. 12/712,456, filed Feb. 25, 2010, entitled METHOD AND APPARATUS FOR DETECTING CELL DETERIORATION IN AN ELECTROCHEMICAL CELL OR BATTERY; U.S. Ser. No. 61/311,485, filed Mar. 8, 2010, entitled BATTERY TESTER WITH DATABUS FOR COMMUNICATING WITH VEHICLE ELECTRICAL SYSTEM; U.S. Ser. No. 61/313,893, filed Mar. 15, 2010, entitled USE OF BATTERY MANUFACTURE/SELL DATE IN DIAGNOSIS AND RECOVERY OF DISCHARGED BATTERIES; U.S. Ser. No. 12/758,407, filed Apr. 12, 2010, entitled ELECTRONIC BATTERY TESTER WITH NETWORK COMMUNICATION; U.S. Ser. No. 12/765,323, filed Apr. 22, 2010, entitled AUTOMOTIVE VEHICLE ELECTRICAL SYSTEM DIAGNOSTIC DEVICE; U.S. Ser. No. 12/769,911, filed Apr. 29, 2010, entitled STATIONARY BATTERY TESTER; U.S. Ser. No. 61/330,497, filed May 3, 2010, entitled MAGIC WAND WITH ADVANCED HARNESS DETECTION; U.S. Ser. No. 61/348,901, filed May 27, 2010, entitled ELECTRONIC BATTERY TESTER; U.S. Ser. No. 61/351,017, filed Jun. 3, 2010, entitled IMPROVED ELECTRIC VEHICLE AND HYBRID ELECTRIC VEHICLE BATTERY MODULE BALANCER; U.S. Ser. No. 12/818,290, filed Jun. 18, 2010, entitled BATTERY MAINTENANCE DEVICE WITH THERMAL BUFFER; U.S. Ser. No. 61/373,045, filed Aug. 12, 2010, entitled ELECTRONIC BATTERY TESTER FOR TESTING STATIONERY STORAGE BATTERY; U.S. Ser. No. 12/888,689, filed Sep. 23, 2010, entitled BATTERY TESTER FOR ELECTRIC VEHICLE; U.S. Ser. No. 12/894,951, filed Sep. 30, 2010, entitled BATTERY PACK MAINTENANCE FOR ELECTRIC VEHICLES; U.S. Ser. No. 61/411,162, filed Nov. 8, 2010, entitled ELECTRONIC BATTERY TESTER; U.S. Ser. No. 13/037,641, filed Mar. 1, 2011, entitled MONITOR FOR FRONT TERMINAL BATTERIES; U.S. Ser. No. 13/037,641, filed Mar. 1, 2011, entitled MONITOR FOR FRONT TERMINAL BATTERIES; U.S. Ser. No. 13/048,365, filed Mar. 15, 2011, entitled ELECTRONIC BATTERY TESTER WITH BATTERY AGE UNIT; U.S. Ser. No. 13/098,661, filed May 2, 2011, entitled METHOD AND APPARATUS FOR MEASURING A PARAMETER OF A VEHICLE ELECTRICAL SYSTEM; U.S. Ser. No. 13/113,272, filed May 23, 2011, entitled ELECTRONIC STORAGE BATTERY DIAGNOSTIC SYSTEM; U.S. Ser. No. 13/152,711, filed Jun. 3, 2011, entitled BATTERY PACK MAINTENANCE FOR ELECTRIC VEHICLE; U.S. Ser. No. 13/205,949, filed Aug. 9, 2011, entitled ELECTRONIC BATTERY TESTER FOR TESTING STORAGE BATTERY; U.S. Ser. No. 13/205,904, filed Aug. 9, 2011, entitled IN-VEHICLE BATTERY MONITOR; U.S. Ser. No. 13/270,828, filed Oct. 11, 2011, entitled SYSTEM FOR AUTOMATICALLY GATHERING BATTERY INFORMATION; U.S. Ser. No. 13/276,639, filed Oct. 19, 2011, entitled METHOD AND APPARATUS FOR MEASURING A PARAMETER OF A VEHICLE ELECTRICAL SYSTEM; U.S. Ser. No. 61/558,088, filed Nov. 10, 2011, entitled BATTERY PACK TESTER; which are incorporated herein by reference in their entirety.

In general, most prior art battery testers/chargers require tester/charger users to enter information related to the battery (such as battery type, battery group size, battery Cold Cranking Amp (CCA) rating, etc.) via a user input such as a keypad. Reliance on user entry of battery information may result in incorrect information being entered, which in turn can result in inaccurate battery test results or improper charging of the battery. Further, the results for the battery test are typically simply displayed to an operator or, in some more advance configurations, transmitted to another location, for example over a communication link.

SUMMARY OF THE INVENTION

A method and apparatus is provided in which a radio frequency identification (RIFD) tag is associated with the storage battery and is used in conjunction with a battery test, battery charger, or other battery maintenance. A cable configured to be affixed to the storage battery. The cable is configured to store information and communicate the information to a battery tester.

A battery maintenance device configured to couple to the battery and to perform battery maintenance on the battery through the cable. The battery maintenance device includes communication circuitry configured to communicate with a memory of the cable.

DETAILED DESCRIPTION OF THE PREFERRED EMBODIMENTS

Storage batteries are used in many applications including both automotive vehicles as well as stationary implementations such as for use as a backup power supply, etc. It is frequently desirable to perform tests on the batteries so that they're performance capabilities may be evaluated. In order to be able to perform a test on the battery or other battery maintenance, a battery maintenance device must be coupled to the battery through electrical connections. This connection can be a source of errors and inconsistencies in the test measurements. For example, an unskilled operator may improperly connect the cable to the posts of the battery. This will result in, for example, an error in the battery test measurement. Similarly, even if a skilled operator properly connects the cable to the battery a previously obtained inaccurate test result will affect the ability to observe trending in the test measurements. Further, there are various parameters which can be associated with a battery. It would be beneficial to associate those parameters with the battery. In one aspect, the present invention provides a cable which can be permanently, or semi-permanently, affixed to a battery and coupled to the terminals of the battery. This ensures consistent test results and eliminates errors caused by improper connections of the cables to the battery. Further, in one aspect the present invention includes a memory which is associated with the battery. This memory can be carried in the cable and, in one configuration, can contain information which is wirelessly communicated to a battery maintenance device. This communication can be both from the memory to the device as well as from the device to the memory. This allows parameters related to the battery, such as a battery rating, to be stored and associated with the battery. Further still, test results can be stored in the cable memory whereby trends in the measurements can be observed and used to determine the condition of the battery as well as predict its ultimate failure. These techniques are useful in both storage batteries used in, for example, automotive vehicles as well as storage batteries used in stationary configurations and this is reflected in the following discussion.

Figure 1:
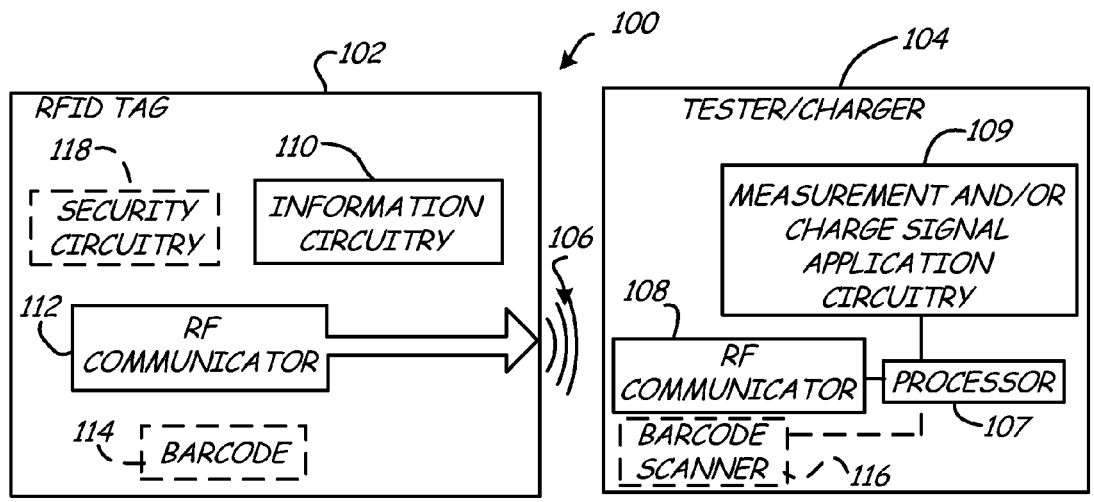
FIG. 1 is a simplified block diagram showing components of a battery testing/charging system in accordance with an embodiment of the present invention.
Figure 2:
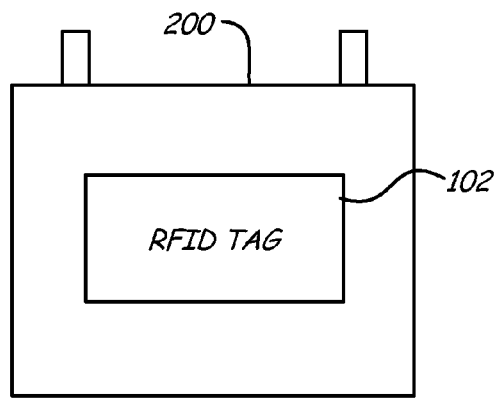
FIG. 2 is a side plan view of a storage battery including a RFID tag in accordance with an embodiment of the present invention.

FIG. 1 is a simplified block diagram of a battery testing/charging system 100 in accordance with an embodiment of the present invention. System 100 includes a radio frequency identification (RFID) tag 102, which can be affixed to a battery (such as 200 (FIG. 2)). RFID tag 102 is configured to transmit stored battery information in the form of RF signals 106. System 100 also includes a battery tester/charger 104 having an embedded/integrated radio frequency (RF) communicator 108, which is configured to receive the transmitted battery information from RF tag 102 when battery tester/charger 104 is proximate RF tag 102. Further, in some configurations, RF communicator 108 is configured to transmit information RF communicator 112 in RFID tag 100. This information can be, for example, stored in information circuitry 110. The battery information, which is automatically received by RF communicator 108, is utilized by processor 107 and measurement and/or charge signal application circuitry 109 to test/charge the battery (such as 200 (FIG. 2)). Thus, system 100 overcomes problems with prior art testers/chargers that, in general, require a tester/charger user to enter battery information with the help of a keypad, for example, during a testing/charging process. Of course, for battery information transfer to occur from RFID tag 102 to tester/charger 104, tester/charger 104 should be within a perimeter defined by RF signal 106. The perimeter is selected based upon a type of application and environment for which system 100 is required. Also, a memory size and encoding scheme for RFID tag 102 can be different for different applications. In general, system 100 allows for battery charging/testing with minimal or no user intervention, thereby substantially eliminating any inaccuracies associated with manual entry of battery information.

As can be seen in FIG. 1, RFID tag 102 includes, as it primary components, a battery information storage circuit 110 and a RF communicator 112. In embodiments of the present invention, battery information storage circuit 110 is configured to store certain basic information regarding the battery. This information includes battery type, battery group size, cold cranking amp (CCA) rating, battery manufacture date (which could later be used for warranty processing), battery cost, etc. In addition to utilizing RFID tag 102 to store the above-noted battery information, RFID tag 102 can also be used to store tracking information, such as a battery serial number, which is useful during the manufacture of the battery, for example. Further, RFID tag 102 could also store previous test results from factory or later tests that could aid in helping to determine battery condition. Previous test information can also be used to show a customer past and present test results. Battery information and other tracking information can be conveniently encoded and RFID tags 102 can be printed on demand using a suitable printer that includes RFID tag printer/encoder programs. In some embodiments, additional information, such as the date of sale of the battery, can be subsequently encoded into RFID tag 102. In embodiments of the present invention, tag or label 102 includes a coating to dissipate static electricity that may corrupt information stored in the tag. As a battery (such a 200) is often used in a harsh and constrained environment, suitable additional protective layers may be used for coating RFID tag 102.

In some embodiments of the present invention, tag 102 also includes bar-coded battery information 114 in addition to the RFID encoded battery information. In some embodiments, the bar-coded battery information may be a copy of the RFID encoded information. In other embodiments, the bar-coded information may be different from the RFID encoded information. Of course, in such embodiments, battery tester/charger 104 includes a barcode reader 116 in addition to RF communicator 108. Tags/labels with the barcode and RFID battery information can be printed from a single printer that includes the necessary label printer/encoder programs. It should be noted that it is possible to produce bar code tags that can contain previous test information that could be useful in providing previous test result information, which could be used in combination with RFID tags, or stand alone information. Production of bar code tags that contain battery test information is described in U.S. Pat. No. 6,051,976, entitled "METHOD AND APPARATUS FOR AUDITING A BATTERY TEST," which is incorporated herein by reference.

In addition to helping automate the battery testing/charging process, battery information stored in RFID tag 102 has other uses such as to help determine whether or not a particular battery is too "old" to be sold. It should be noted that batteries may not be suitable for sale after the expiration of a certain period (16 months, for example). The age of the battery can easily be determined by reading the battery date of manufacture from RFID tag 102. An RFID reader that can automatically detect, identify and accept battery information from all RFID tags in its reading field is especially suitable for a retailer to rapidly identify "old" batteries. Information, such as the date of sale of the battery, included in RFID tag 102, can be used for automating warranty claims processing which is based on the battery age, date of sale, etc. Thus, RFID tag 102 is useful for battery production, storage, monitoring and tracking.

In some embodiments of the present invention, RFID tag 102 includes security circuitry 118, which may be coupled to RF communicator 112 and may also include a receiver (not shown in FIG. 1) which is capable of receiving signals from an external transmitter (not shown in FIG. 1) that transmits security signals. Details regarding such a security system are included in U.S. Ser. No. 10/823,140, filed Apr. 13, 2004, entitled "THEFT PREVENTION DEVICE FOR AUTOMOTIVE VEHICLE SERVICE CENTERS," which is incorporated herein by reference. Details regarding components of battery tester/charger 104 are provided below in connection with FIGS. 3 and 4.

Figure 3:
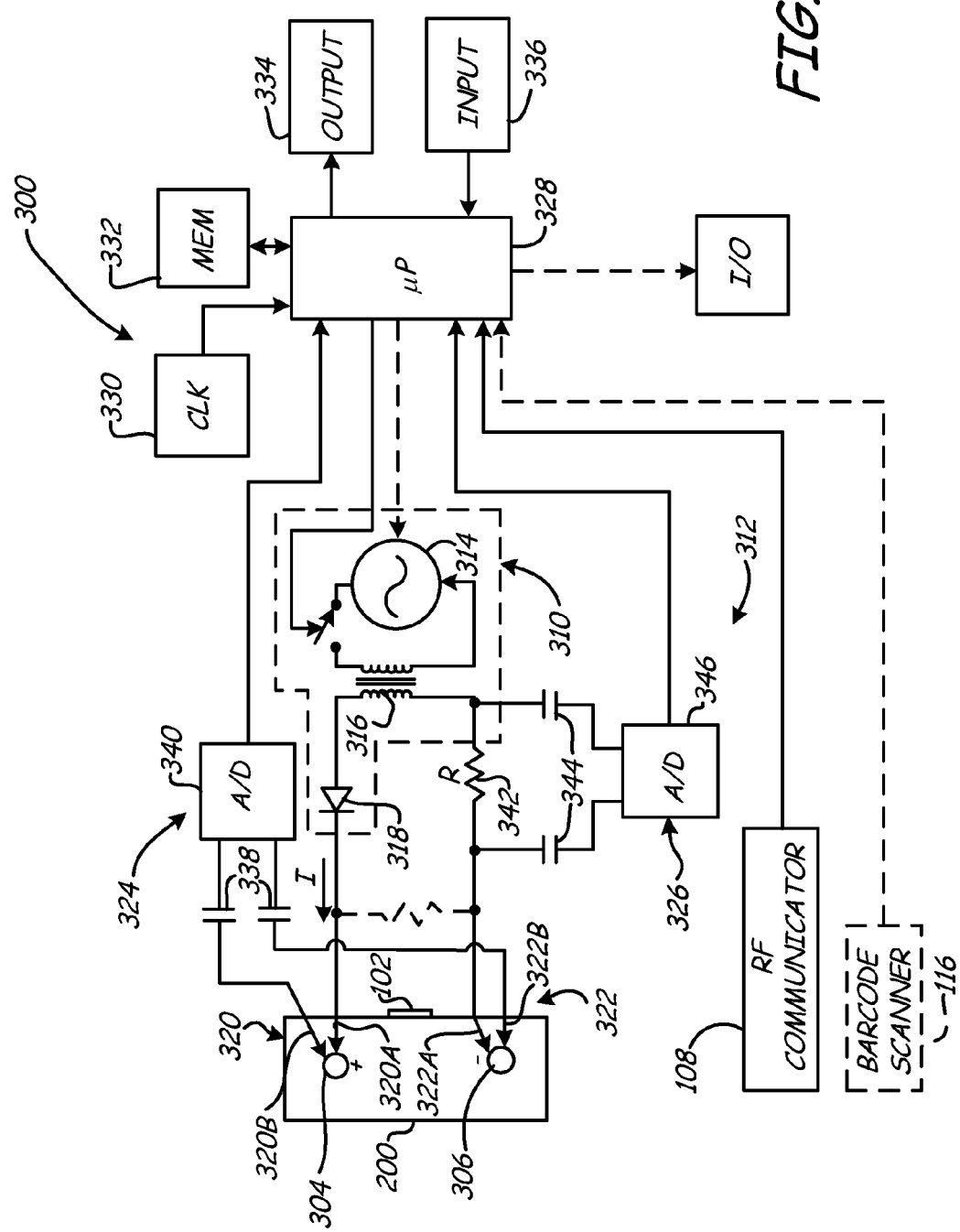
FIG. 3 is a simplified block diagram of an example battery charging system that is capable of receiving information from the RFID tag.

FIG. 3 is a simplified block diagram of a battery charging system 300 in accordance with an embodiment of the present invention. System 300 is shown coupled to battery 200. System 300 includes battery charger circuitry 310 and test circuitry 312. Battery charger circuitry 310 generally includes an alternating current (AC) source 314, a transformer 316 and a rectifier 318. System 300 couples to battery 200 through electrical connection 320 which couples to the positive battery contact 304 and electrical connection 322 which couples to the negative battery contact 306. In one preferred embodiment, a four point (or Kelvin) connection technique is used in which battery charge circuitry 310 couples to battery 300 through electrical connections 320A and 322A while battery testing circuitry 312 couples to battery 200 through electrical connections 320B and 322B.

Battery testing circuitry 312 includes voltage measurement circuitry 324 and current measurement circuitry 326 which provide outputs to microprocessor 328. Microprocessor 328 also couples to a system clock 330 and memory 332 which is used to store information and programming instructions. In the embodiment of the invention shown in FIG. 3, microprocessor 328 also couples to RF communicator 108, user output circuitry 334, user input circuitry 336 and barcode scanner 116, which may be included in some embodiments.

Voltage measurement circuitry 324 includes capacitors 338 which couple analog to digital converter 340 to battery 200 thorough electrical connections 320B and 322B. Any type of coupling mechanism may be used for element 338 and capacitors are merely shown as one preferred embodiment. Further, the device may also couple to DC signals. Current measurement circuitry 326 includes a shunt resistor (R) 342 and coupling capacitors 344. Shunt resistor 342 is coupled in series with battery charging circuitry 310. Other current measurement techniques are within the scope of the invention including Hall-Effect sensors, magnetic or inductive coupling, etc. An analog to digital converter 346 is connected across shunt resistor 342 by capacitors 344 such that the voltage provided to analog to digital converter 346 is proportional to a current I flowing through battery 200 due to charging circuitry 310. Analog to digital converter 346 provides a digitized output representative of this current to microprocessor 328.

During operation, AC source 314 is coupled to battery 200 through transformer 316 and rectifier 318. Rectifier 318 provides half wave rectification such that current I has a non-zero DC value. Of course, full wave rectification or other AC sources may also be used. Analog to digital converter 346 provides a digitized output to microprocessor 328 which is representative of current I flowing through battery 200. Similarly, analog to digital converter 324 provides a digitized output representative of the voltage across the positive and negative terminals of battery 200. Analog to digital converters 324 and 346 are capacitively coupled to battery 200 such that they measure the AC components of the charging signal.

Microprocessor 328 determines the conductance of battery 200 based upon the digitized current and voltage information provided by analog to digital converters 346 and 324, respectively. Microprocessor 328 calculates the conductance of battery 200 as follows:

$$\text{Conductance} = G = \frac{I}{V} \qquad \text{Eq. 1}$$

where I is the AC charging current and V is the AC charging voltage across battery 200. Note that in one preferred embodiment the Kelvin connections allow more accurate voltage determination because these connections do not carry substantial current to cause a resultant drop in the voltage measured.

The battery conductance is used to monitor charging of battery 200. Specifically, it has been discovered that as a battery is charged the conductance of the battery rises which can be used as feedback to the charger. This rise in conductance can be monitored in microprocessor 328 to determine when the battery has been fully charged.

In accordance with the present invention, as described above, RF communicator 108 and/or barcode scanner 116 are included to substantially eliminate the need for user entry of the necessary battery information.

Figure 4:
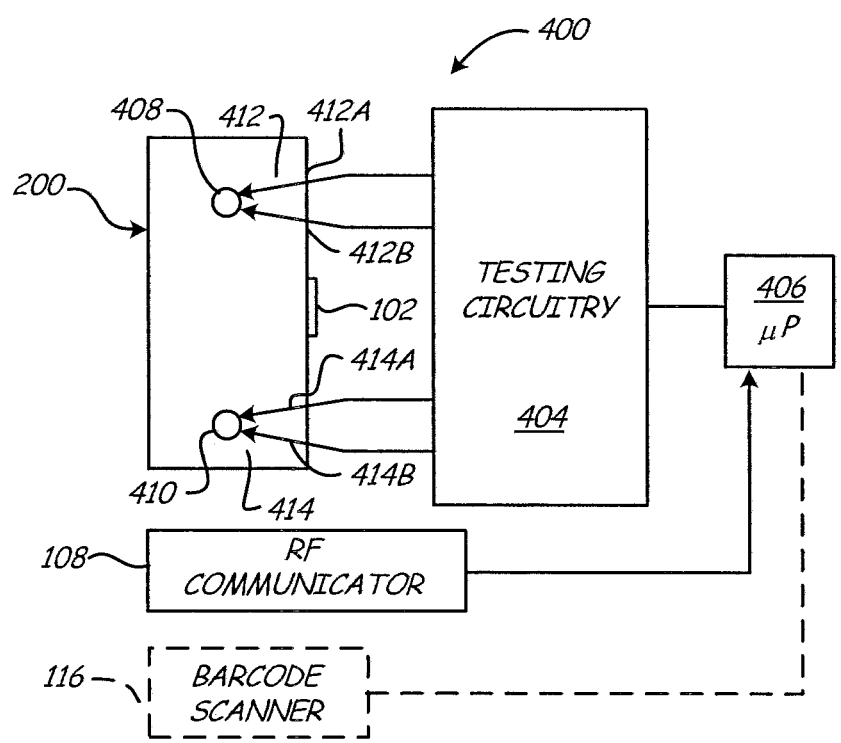
FIG. 4 is a simplified block diagram of an example battery tester that is capable of receiving information from the RFID tag.

FIG. 4 is a simplified block diagram of a battery testing system 400 in accordance with an embodiment of the present invention. System 400 is shown coupled to battery 200. System 400 includes battery testing circuitry 404 and microprocessor 406. System 400 couples to battery contacts 408 and 410 through electrical connections 412 and 414, respectively. In one preferred embodiment, a four point (or Kelvin) connection technique is used. Here, electrical connection 412 includes a first connection 412A and second connection 412B and connection 414 includes a first connection 414A and a second connection 414B. As in the case of battery charging system 300 (FIG. 3), battery testing system 400 also includes RF communicator 108 and barcode scanner 116 to substantially eliminate the need for user entry of the necessary battery information. Battery tester 400 utilizes received battery information to determine a condition of storage battery 200. A description of example components which can be employed to form battery testing circuitry 404 is set forth in U.S. Pat. No. 6,323,650, issued Nov. 27, 2001, and entitled "ELECTRONIC BATTERY TESTER," which is incorporated herein by reference.

Figure 5:
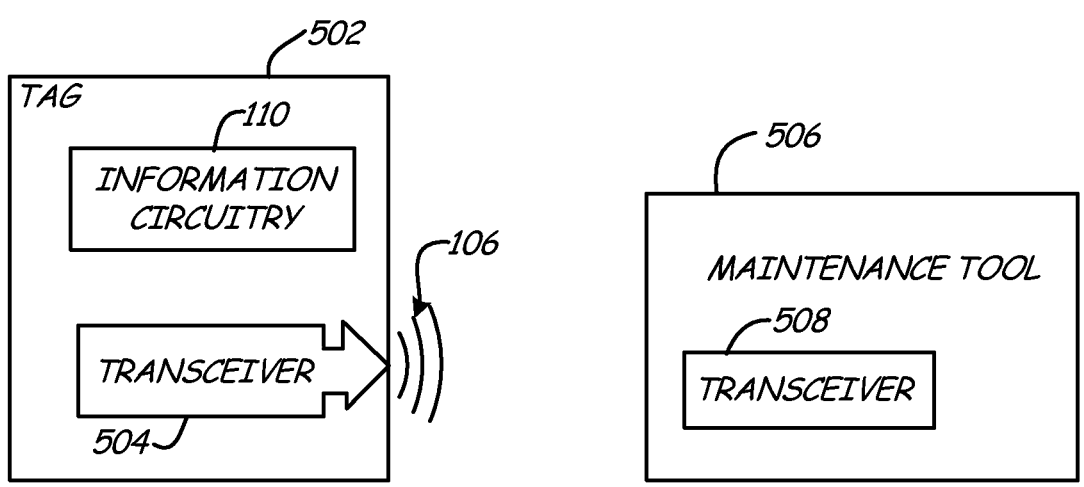
FIG. 5 is a simplified block diagram of a battery maintenance system in accordance with an embodiment of the present invention.

The above-described invention can be employed in either portable or "bench" (non-portable) battery charging and testing systems, and other similar applications such as starter and alternator testing systems. Although the example embodiments described above relate to wireless communication (or transfer of battery information) using RF signals, other wireless communication techniques (for example, diffused infrared signals) that are known in the industry or are developed in the future may be employed without departing from the scope and spirit of the present invention. A general embodiment of a tag (which can be associated with a storage battery) that can wirelessly transmit information to, or receive information from, a battery maintenance tool (tester, charger, etc.) is shown in FIG. 5. Tag 502 includes information circuitry 110 similar to that described in FIG. 1 and a transceiver 504 for communicating with maintenance tool 506, which also includes a transceiver 508. Different embodiments of tag 502 and maintenance tool 506 can use different wireless communication techniques. Transceivers 504 and 508 can be configured to send and/or receive information. The battery maintenance tool 506 can be any tool which is used to perform maintenance on a battery. Two examples include a battery tester and a battery charger.

Figure 6A:
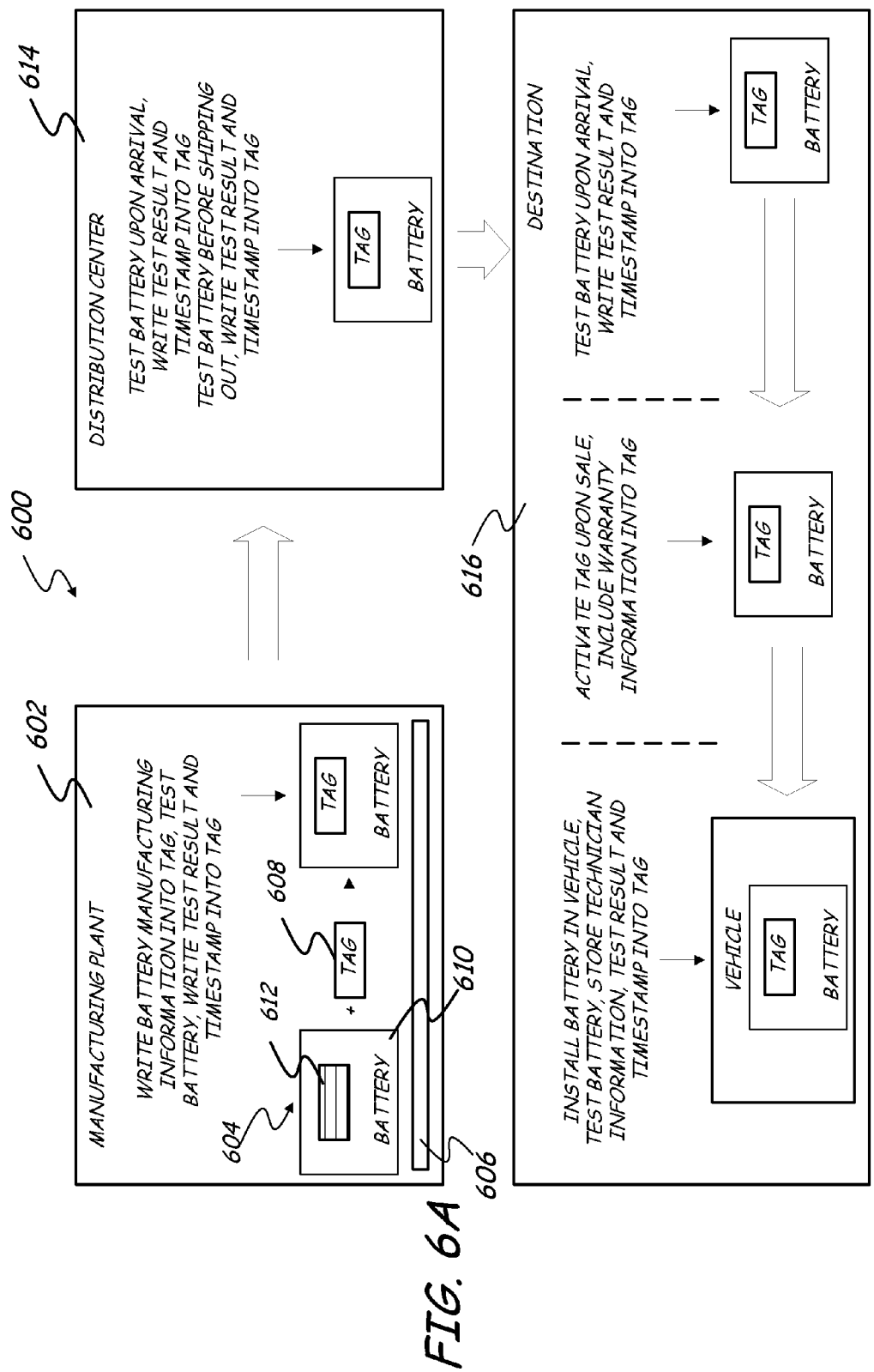
FIG. 6A is a simplified block diagram illustrating the use of information in an RFID tag affixed to a battery at different stages in the life of the battery.

There are several factors that relate to the manufacture, distribution, purchase and treatment of batteries, such as automotive batteries, that impact battery life. For example, when an battery such as automotive battery is purchased, the freshness of the new battery has an impact on the life of the battery because the longer the battery remains in storage without being recharged, the more damaging sulfation there may be on the plates within the battery. Also, consistent and accurate testing and recording of battery test results is important. Thus, in some embodiments, a RFID tag is used to store information about the battery and battery test results at different stages in the life a battery. FIG. 6A illustrates an example of such an embodiment. As can be seen in block diagram 600 of FIG. 6A, battery 604 is assembled on assembly line 606 at manufacturing plant 602. At the end of the assembly of battery 604, RFID tag 608 is affixed to battery housing 610. In one embodiment, battery housing 610 includes a recessed portion 612 within which the RFID tag 608 is affixed. This prevents damage of the RFID tag 608 during transportation and storage of the battery 604, for example. In general, at manufacturing plant 602, battery manufacturing information is stored into RFID tag 608. This can include manufacturing plant and assembly line identification information. In addition to the particular assembly line, the shift during which the battery was assembled can also be stored into the RFID tag 608. Such detailed information related to the manufacture of the battery is useful for quality control audit purposes. Battery manufacturing information stored into RFID tag 608 also includes battery parameters and other battery information such as battery type (for example, flooded (wet), gelled, AGM (Absorbed Glass Mat, etc.), battery rating (for example, cold cranking ampere (CCA) rating), battery post configuration (top post or side post), etc. This battery-specific information facilitates the formation/coding of an algorithm that is tailored to the specific battery type, battery post configuration, etc. The algorithm can be stored into the RFID tag 608 and read and utilized by a battery tester each time the battery is tested, thereby making the type of battery test carried out on the battery consistent and substantially independent of any need for data entry by a battery tester user. After the above-described manufacturing information is loaded in to RFID tag 608 at the manufacturing plant, the battery is tested. As can be seen in FIG. 6A, in manufacturing plant 602, battery 604 is tested using information for RFID tag 608 and a timestamp for the test along with the battery test results are written into RFID Tag 608.

Batteries such as 604 are shipped from a manufacturing plant such as 602 to a distribution center 614. In some embodiments, upon arrival at the distribution center 614, the battery 602 is tested and a timestamp for the test along with the battery test results are written into the RFID tag 608. The battery storage location in the distribution center can also be stored in the RFID tag 608. In some embodiments, prior to shipping the battery 604 to a destination 616, a battery test is again performed at distribution center 614. A timestamp for the test along with the battery test results are written into the RFID Tag 606. Upon arrival at a destination such as a dealership, backup power station, etc., as illustrated at 616 in FIG. 6A, battery manufacturing information is read from RFID tag 608.

Using the information read from tag 608, a battery test is conducted on battery 604 at the automobile destination 616. A battery test result is obtained and the battery test result and a corresponding timestamp stored into the RFID tag 608.

In some embodiments, a battery sale activation code is programmed into RFID tag 608 at the automotive destination 616. The battery sale activation code is stored in a database. The database also stores information that indicates that the battery is currently for sale at the automotive destination 616. When selling battery 604 to a customer, the battery sale activation code is read from the RFID tag and utilized to update the database to reflect that the battery has been sold. In general, the sale of battery 64 is proper only if the RFID tag 608 is properly activated. This prevents situations such as a person stealing battery 604 and then returning it to claim a refund, for example. Specifically, this security feature will show that the battery/RFID tag was not properly activated at the time of sale if a return of a stolen battery is attempted.

Selling the battery 604 to the customer may also involve storing battery warranty information and a date of sale of the battery into the RFID tag 608. One embodiment of a warranty management method is described below in connection with FIG. 6B.

Figure 6B:
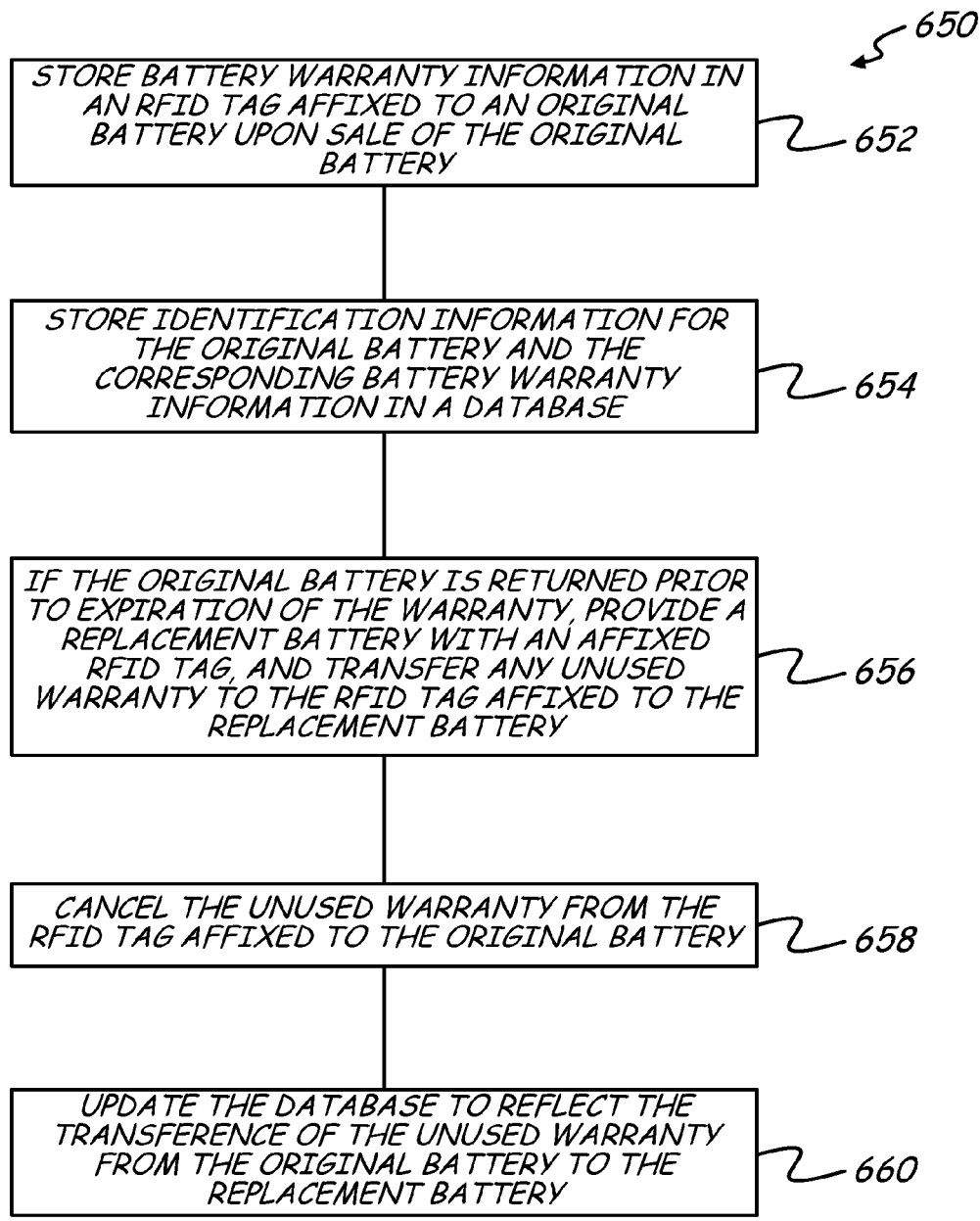
FIG. 6B is a flowchart showing steps of a warranty management method in accordance with one embodiment.

FIG. 6B is a flowchart 650 showing steps of a warranty management method in accordance with one embodiment. At step 652, battery warranty information is stored in an RFID tag affixed to an original battery upon sale of the original battery. Also, at step 654, identification information for the original battery and the corresponding battery warranty information are stored in a database. At step 656, if the original battery is returned prior to expiration of the warranty, a replacement battery with an affixed RFID tag is provided to the customer, and any unused warranty is transferred to the RFID tag affixed to the replacement battery. At step 658, the unused warranty is cancelled from the RFID tag affixed to the original battery. Further, at step 660, the database is updated to reflect the transference of the unused warranty from the original battery to the replacement battery.

Referring back to FIG. 6A, after entry of battery warranty information into RFID tag 608, battery 604 is installed in a vehicle owned by the customer. Battery 604 is tested upon installation in the vehicle. As described earlier, testing of battery 604 involves reading the battery manufacturing information from the RFID tag 608, conducting a battery test using the battery manufacturing information, and obtaining a battery test result. The battery test result and a corresponding timestamp is stored into the RFID tag 608. In some embodiments, test technician information is also stored into the RFID tag 608. Details about linking vehicle information with battery manufacturing information and battery warranty information in the RFID tag is described below in connection with FIG. 7.

Figure 7:
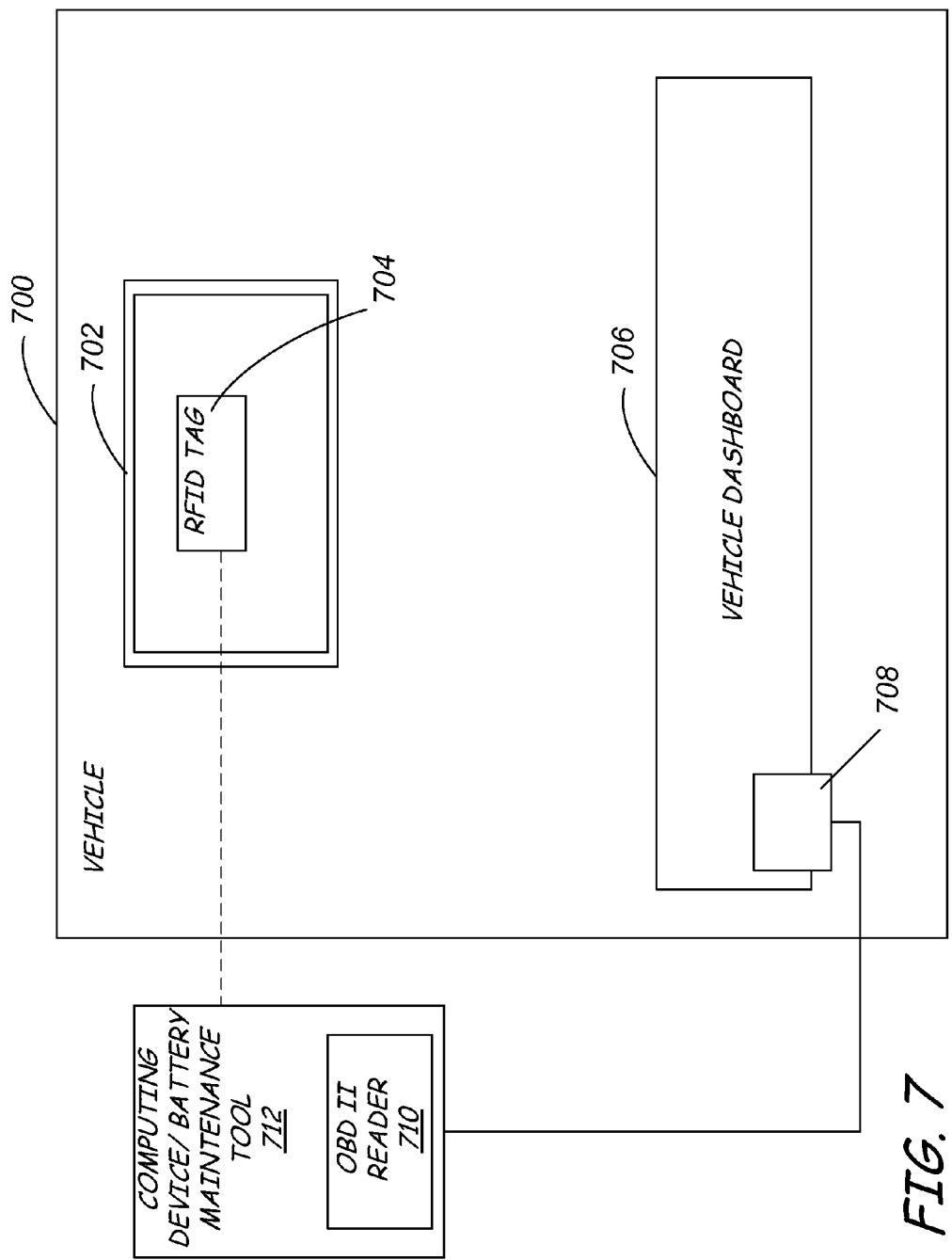
FIG. 7 is a simplified block diagram showing a vehicle having a battery with an affixed RFID tag in accordance with one embodiment.

FIG. 7 is a simplified block diagram showing a vehicle 700 having a battery 702 with an affixed RFID tag 704 in accordance with one embodiment. Vehicle 700 has an on-board diagnostic II (OBDII) connection 706. OBDII connections are known in the art and are used to couple to the OBDII databus (not shown) of modern vehicles. Although, in FIG. 7, vehicle OBDII connection 708 is shown positioned in dashboard 706, connection 708 can be positioned in any suitable location within vehicle 700. The OBD databus, and therefore OBDII connection 708, can be used to retrieve information related to various parameters, such as engine parameters, of the vehicle. Additionally, the OBDII connection 708 provides a connection to the vehicle battery 702. In general, engine parameters, vehicle battery voltage and the vehicle identification number (VIN) can be obtained from the OBDII connection 708. Thus, any suitable connector from a device separate from, or external to, vehicle 700 can be coupled to OBDII connection 708 to obtain the VIN, engine parameters, battery voltage, etc., of vehicle 700. The devices used to obtain the OBDII information can include an OBDII reader 710, which can be separate from, or a part of, a computing device or battery maintenance tool 712. The VIN, engine parameters and battery voltage can be obtained from the OBDII connection 708 and can be programmed into memory of RFID tag 704 using battery maintenance tool 712 or any other suitable device at a vehicle dealership, for example. This, stored information can be read from RFID tag 704 prior to subsequent testing and can help in diagnosing and isolating battery, alternator and/or vehicle starter problems more rapidly and accurately. As indicated above, whether the VIN is obtained via OBDII connection 708, entered manually into a computing device capable of storing the information if RFID tag 704, or obtained using any other suitable method, a VIN stored in RFID tag 704 is useful to tie battery warranty to a specific vehicle. As noted above, the serial number of the battery and warranty information is also stored into the RFID tag.

Figure 8:
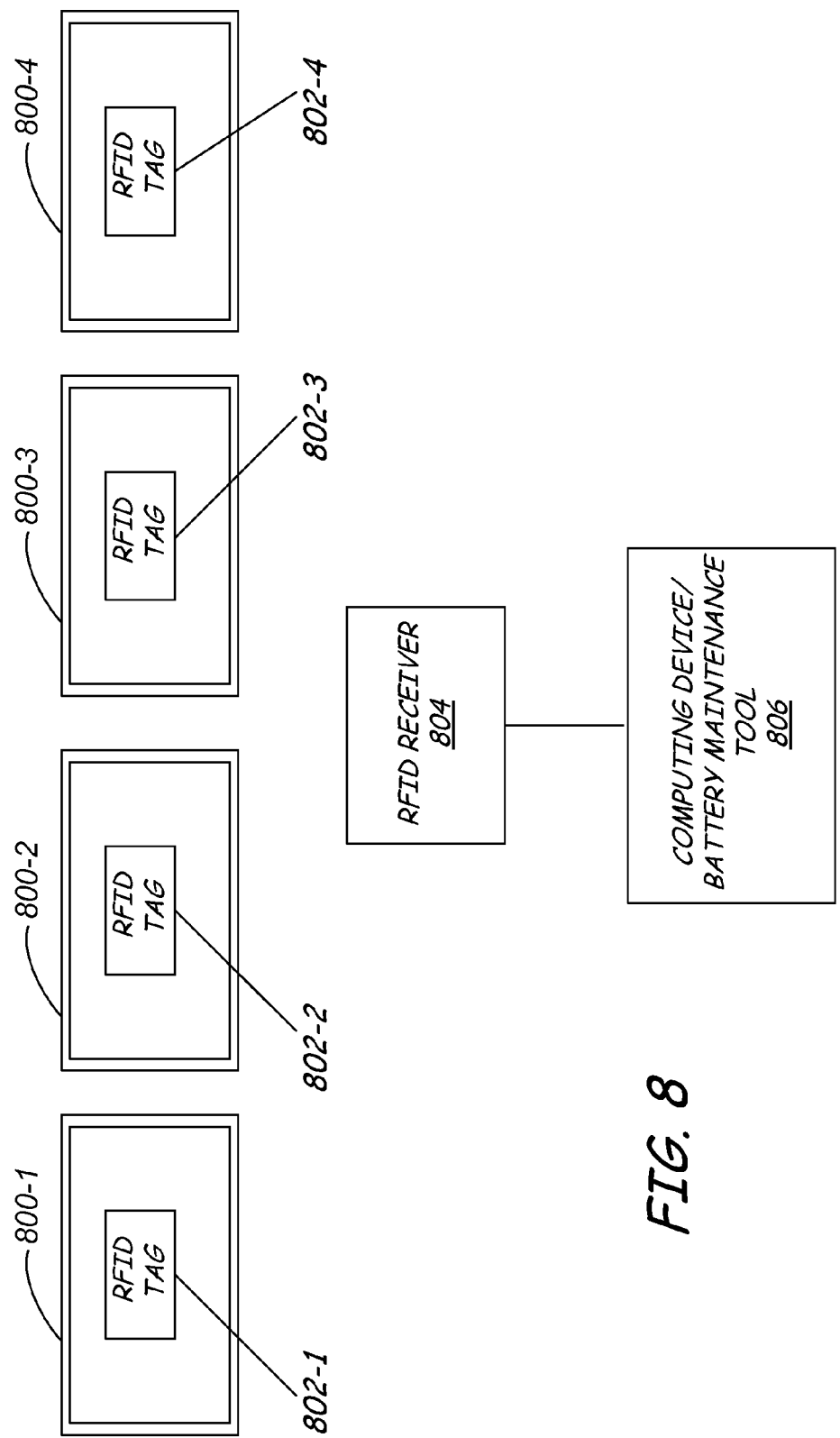
FIG. 8 is a simplified block diagram showing multiple batteries with each of the batteries including an RFID label with balancing information.

In some embodiments, balancing information for multiple battery packs is stored into the RFID tag(s). FIG. 8 shows multiple batteries 800-1 through 800-4, each including a corresponding one of RFID tags 802-1 through 802-4. Battery balancing information in the RFID tags can be used in applications for heavy trucks or stationary power supplies, for example. In such applications, information stored in the RFID tags (802-1, 802-2, 802-3 and 802-4) can include cranking capacity, time in service, miles in service, geographical location, the results of prior battery tests, the number of charged, discharged cycles a battery has undergone, a total number of battery tests performed on the battery, the age of the battery, the battery rating, etc. Specifically, information from individual RFID tags (802-1, 802-2, 802-3, 802-4) can be obtained using RFID receiver 804 and transferred to computing device/battery maintenance tool 806 that includes a memory and a processor that executes program code, which utilizes the information obtained from the individual RFID tags to automatically sort and match appropriate batteries for fleet maintenance, for example. In FIG. 8, RFID receiver 804 is shown as a separate component coupled to computing device/battery maintenance tool 806. However, in some embodiments, RFID receiver 804 is a part of, or integrated with, computing device/battery maintenance tool 806.

As indicated above, in some embodiments, a battery purchase location identifier (store identification number or any other suitable equivalent) is stored into the RFID tag affixed to the battery. Also, as indicated above, storing the date of purchase of the battery into the RFID tag starts the warranty clock.

In some embodiments, a name or other identification information for a technician who tests the storage battery is stored into the RFID tag. This allows for automatic statistical checking of technician proficiency, for example, with the help of a computing device that employs the technician-related information in the RFID tag to determine technician proficiency.

As noted above, in some embodiments, battery test related information, such as battery test results are stored in an RFID tag affixed to the battery. Additionally, in some embodiments, battery trending information (for example, results of multiple tests over time) is stored into the RFID tag affixed to the battery. In such embodiments, battery degradation can be more accurately determined than by using a simple one point snapshot test. Also, data relating to a series of test steps can be stored into the RFID tag. For example, pre-charge test results and a corresponding time stamp and post-charge test results and a corresponding time stamp can be stored. This can be read by a battery maintenance tool and can be used, for example, to determine if enough time has elapsed to allow a proper battery charge.

As noted above, test results and test related data over multiple battery tests over time can be stored in the RFID tag affixed to the battery. The enables a battery maintenance tool having a memory and a processor to carry out a method for retrieving data from a previous test from the RFID tag and comparing the retrieved data to present test data. Also, prior test data from the RFID tag is, in some embodiments, utilized by the battery maintenance tool to determine a "slope" or rate of degradation of the battery to which the RFID tag is associated. Both pre and post load test results can be stored in the RFID tag, affixed to the battery, and utilized for computations by a battery maintenance tool. The stored battery test-related information, read from the RFID tag and utilized by a battery maintenance tool for battery analysis, could be from two completely different points in time and can be accumulated each time the battery is tested.

Figure 9:
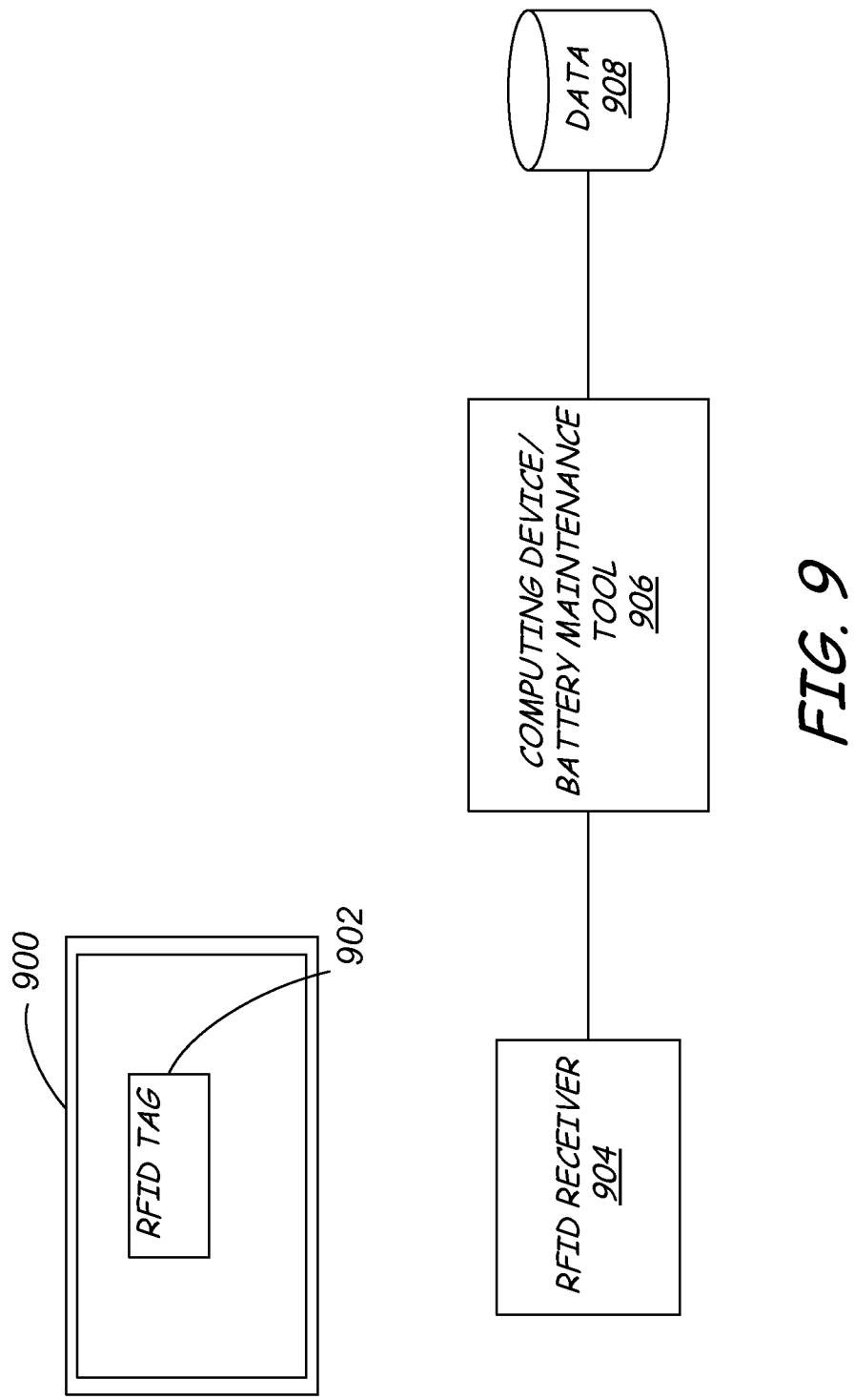
FIG. 9 simplified block diagram showing a method for fraud prevention when RFID tags are used to store battery related information.

FIG. 9 simplified block diagram showing a method for fraud prevention when RFID tags are used to store battery related information. In essence, this method involves retrieving data stored in an RFID tag (such as 902) affixed to a battery (such as 900) and comparing the retrieved data with independent data at a remote database (such as 908). In FIG. 9, RFID receiver 904 is used to retrieve data from RFID tag 902 and computing device/battery maintenance tool 906 is used to compare the retrieved data with independent data retrieved from database 908. Database 908 can be stored in memory of a remote computer, which communicates with computing device/battery maintenance tool 906 using wired or wireless communication. Database 908 can store a copy of warranty information stored in RFID tag 902 at the time of sale of battery 900 by a dealership, for example. Thus, at a later time, when the battery 900 is brought to the dealership, the above data comparisons can be used, for example, to determine whether warranty information stored in the RFID tag 902 has been altered subsequent to purchase to improperly gain additional warranty. In general, this data comparison technique is particularly useful for the purpose of fraud prevention and/or warranty verification.

As noted above, in some embodiments, the battery manufacturing date and the data of sale of the battery or the battery in-service date (date the battery was put in service) are stored into the RFID tag associated with the battery. In one embodiment, the battery manufacturing date from the RFID tag is used, by a battery maintenance tool or other computing device, to compare with the battery in-service date for tracking battery shelf life and supply chain stock rotation problems (i.e., improper first in, first out (FIFO) inventory control).

As noted earlier, in some embodiments, manufacturing plant or assembly line information is stored into the RFID tag associated to the battery. In addition to the particular assembly line, the shift during which the battery was assembled can also be stored in the RFID tag. Such detailed information related to the manufacture of the battery is useful for quality control audit purposes. Obtaining manufacturing related information from the RFID tags and processing of this information for quality control audit purposes is carried out by a suitable computing device having an RFID receiver, a processor and a memory with necessary programmed instructions.

Figure 10:
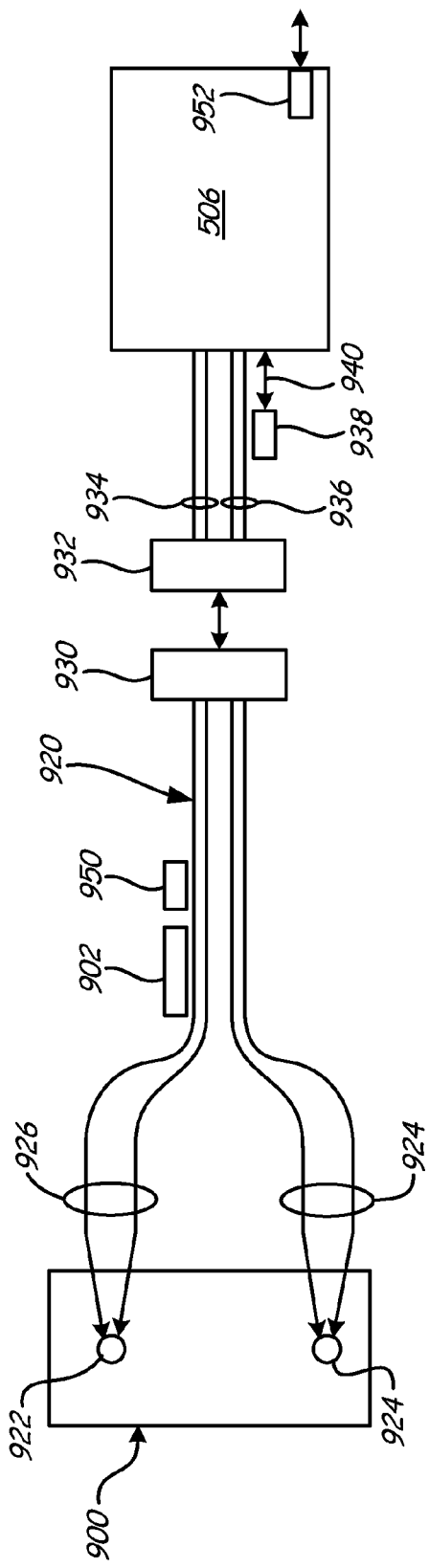
FIG. 10 is a simplified block diagram showing a cable affixed to a battery in which the cable includes a RFID tag.

FIG. 10 shows another example configuration of RFID tag 902 associated with a storage battery 900. In the configuration of FIG. 10, battery maintenance cable 920 is permanently or semi-permanently attached to terminals 922 and 924 of battery 900. Cable 920 is illustrated as providing Kelvin connections 926 and 928 to terminals 922 and 924, respectively. A battery maintenance device, for example maintenance tool 506 shown in FIG. 5, can couple to cable 920 through, for example, plugs 930 and 932. The Kelvin connection to the device 506 is continued from plug 932 through wiring 934, 936. An RFID communicator 938 is coupled to the cable and is configured to read and/or write information to RFID tag 902 from battery tester 506 through data bus 940. Although the communication device 938 is shown as separate from tester 506 and associated with the cabling, the device 938 could also be located within battery tester 506. When the battery maintenance device 506 is coupled to cable 920, the device will be in sufficiently close proximity to RFID tag 902 to allow communication there between. This configuration allows existing batteries to be easily retrofit with an RFID tag 902 simply by coupling a cable 920 to the battery 900. During operation, information regarding various battery tests can be stored in the memory of RFID tag 902. This allows battery 506 tester to retrieve stored information for use in monitoring the storage battery 900. For example, stored test results can be recovered and used to provide trending information about the battery. This can be used, for example, to predict a failure of the battery or a time at which the battery should be replaced.

As discussed previously, the connection between the battery and battery maintenance device can be a source of errors due to inconsistencies in the connection when performing battery tests. Technicians, with varying levels of training and experience, may encounter difficulties with the set up and use of the test equipment. With the present invention, the cabling can be permanently or semi-permanently coupled to the battery thereby eliminating the connection as a source of errors in measurements. Further, the RFID tag 902 can include information related to the battery 900. This information can be read by the tester whereby the amount of information which must be manually entered into the tester is reduced or substantially eliminated. Such information includes reference values for various parameters of the battery, nominal voltage, information from prior tests, etc. This information can be stored in the memory of the RFID tag 902 during manufacture or installation of the battery, for example. This allows the manufacturer or installer to set these values based upon a particular battery, lot of batteries, particular use of the battery, etc. For example, a battery identifier such as a unique serial number may be associated with the battery, nominal battery voltage, the amp per hour rating of the battery, a conductance reference of the battery, the manufacturing date of the battery, the installation date of the battery, etc.

Additionally, information can be written into the memory of the RFID tag 902 following manufacture. This includes the installation date, as well as information about subsequent measurements. For example a time or date stamp can be stored, measured voltage, measured temperature, measured conductance, identification of the technician performing the test, etc. A temperature measurement can be obtained by using a temperature sensor contained within the battery tester 506, or, for example in a temperature sensor 950 associated directly with a specific battery 900. In one example configuration, the memory contains 80 registers for storing this information. Additional memory can be added simply by adding an additional RFID tag. The RFID tag 902 can be activated when it is in close proximity to the RFID tag reader/writer 938. For example, an inductive connection can occur between the components. As discussed previously, the battery tester 506 can collect previous test measurements or other information from the memory and use this information for developing trends in the battery operation. This can be used to identify a battery which is rapidly failing, or predict an ultimate end of life of the battery, or use by a manufacturer to improve the manufacturing process. For example, input/output circuitry 952 which can be used to read back information from tester 506. This can be, for example, USB connection whereby a PC or other device can be used to recover information read back from the RFID tag 902. A manufacturer can use this information to determine how a particular battery is being used, identify failing batteries, improve the manufacturing process, etc. As a more specific example, any alarms or anomalies which are noted can be used to trigger an alert or e-mail which is transmitted.

Although the present invention has been described with reference to preferred embodiments, workers skilled in the art will recognize that changes may be made in form and detail without departing from the spirit and scope of the invention. It should be noted that the barcode(s) (used in some embodiments of the tag) and the corresponding barcode scanner (used in some embodiments of the tester/charger) are optional and therefore the invention can operate only with the RFID encoded battery information in the tag and a corresponding RF receiver in the tester/charger. It should be noted that the above invention is suitable for use in battery testers, chargers or a combined battery tester and charger. Although the above description has been directed to battery maintenance devices such as battery testers and battery chargers, the present invention is applicable to any type of battery test device. Further, the RFID tags can be associated with a particular battery using any appropriate technique. The invention is not limited to the above examples of mounting the RFID tag to the battery or affixing a test cable to the battery. In one configuration, additional memory is provided by associating more than one RFID tag. For example, if an RFID tag is low on memory for storage of information, an additional RFID tag may be associated with the battery. Both tags can be used by the battery maintenance device and communicated therewith. For example, the RFID tags may include different addresses so that they may be communicated with individually. The RFID tags are configured to store battery information. Examples of battery information include information related to the rating of the battery, the result(s) of prior battery tests, temperature information, environment information, geographic information, information related to manufacturing such as manufacturing date or location, warranty information, information related to the person who performed the battery test or installed the battery, information related to anomalies regarding the battery, etc. In one configuration, the RFID tag may include information related to more than one battery. In another example configuration, the RFID tag may be configured to store notes or other information which is inputted by an operator. This information can be retrieved by an operator during a subsequent examination of the battery. For example, the information may indicate that an operator noted a manufacturing defect or observed a failure or impending failure in the external casing of the battery, notations regarding the location of the battery or condition of the site, etc. In one aspect, the RFID tag includes information such as an address which uniquely or semi-uniquely identifies the battery to which it is associated. Additionally, by storing parameters in the RFID tag, this reduces or eliminates errors that may occur when an operator inputs these parameters a battery maintenance device. The configuration also improves the efficiency of the testing because an operator can quickly plug the tester into the Kelvin connection of the battery. Further, because the operator does not need to input test parameters, this step is also eliminated from the testing.

What is claimed is:

1. A method comprising:
   associating a radio frequency identification (RFID) tag with a storage battery;
   storing battery information into the RFID tag;
   wirelessly reading the battery information from the RFID tag;
   testing the battery with an external electronic battery tester using the battery information by measuring a response of the storage battery to an applied signal and responsively obtaining a battery test result; and
   wirelessly storing the battery test result into the RFID tag using an RF communicator in the electronic battery tester, including a plurality of battery test results obtained over time carried out on the battery as a basis for subsequent testing of the battery.

2. The method of claim 1 including the step of identifying trends in the battery test results based upon the battery information retrieved from the RFID tag.

3. The method of claim 1 wherein the testing is performed at a manufacturing plant.

4. The method of claim 1 wherein the testing is performed at a stationary location of the battery during normal operation of the battery.

5. The method of claim 1 and further comprising storing test technician information into the RFID tag.

6. The method of claim 1 and further comprising:
   obtaining information related to the vehicle in which the battery is installed; and
   storing the information related to the vehicle in the RFID tag.

7. The method of claim 1 wherein the battery information comprises battery temperature information.

8. The method of claim 1 including storing timestamp information in the RFID tag.

9. The method of claim 1 including identifying trends in battery test results.

10. The method of claim 1 wherein associating comprises attaching the RFID tag to the storage battery.

11. The method of claim 1 wherein associating comprises of attaching a cable which includes the RFID tag to the battery.

12. The method of claim 1 including adding an additional RFID tag to provide additional memory.

13. The method of claim 1 wherein the battery information comprises battery rating.

14. An apparatus comprising:
   a radio frequency identification (RFID) configured to be associated with a storage battery, the RFID tag is configured to store and wirelessly transmit information related to the battery;
   an external electronic battery tester configured to perform a battery test on the storage battery by measuring a response of the storage battery to an applied signal and responsively obtaining a battery test result, the electronic battery tester including:
   a computing device comprising:
      a computing device memory;
      a processor; and
      a receiver, which operates under the control of the processor, configured to receive the transmitted information related to the battery,
      wherein the RFID tag is configured to store information received wirelessly, related to a plurality of battery test results obtained over time carried out on the battery, and as a basis for subsequent testing of the battery.

15. The apparatus of claim 14 and wherein the RFID tag is further configured to store information related to a vehicle in which the battery is used.

16. The apparatus of claim 14 and wherein the computing device comprises a battery tester.

17. The method of claim 16 including performing a battery test using the cable.

18. The apparatus of claim 16 and wherein the battery tester is configured to program test technician information into the RFID tag.

19. The apparatus of claim 16 and wherein the battery tester is configured to identify degradation of the storage battery based on the stored information related to the plurality of battery tests.

20. The apparatus of claim 14 and wherein the battery tester is further configured to determine a slope of degradation of the battery.

21. The apparatus of claim 14 including a cable configured to be affixed to the battery, the cable for use in performing a battery test on the battery.

22. The apparatus of claim 21 wherein the RFID tag is coupled to the cable.

23. The apparatus of claim 21 wherein the cable provides a Kelvin connection to the battery.

24. The apparatus of claim 21 including a temperature sensor configured to sense a temperature of the battery and wherein the RFID tag is configured to store battery temperature information.

25. The apparatus of claim 14 including a label affixed to the battery and wherein the RFID tag in included in the label.

26. The apparatus of claim 14 including an additional RFID tag to provide additional storage memory.

27. An apparatus comprising:
   a radio frequency identification (RFID) tag configured to be associated with a storage battery, the RFID tag configured to store battery information related to a plurality of battery tests obtained over time carried out on the battery, to transmit the stored battery information wirelessly to a battery tester, to wirelessly receive battery test results based on battery tests performed in response to the stored and transmitted battery information, and to store the wirelessly received test results; and an external electronic battery tester configured to perform a battery test on the storage battery by measuring a response of the storage battery to an applied signal and responsively obtaining a battery test result comprising:
a computing device memory;
a processor; and
an RF communicator, which operates under the control of the processor, configured to receive the transmitted stored battery information, and to transmit battery test results to the RFID tag.

* * * * *

UNITED STATES PATENT AND TRADEMARK OFFICE
CERTIFICATE OF CORRECTION

PATENT NO. : 9,496,720 B2  Page 1 of 1
APPLICATION NO. : 13/357306
DATED : November 15, 2016
INVENTOR(S) : Stephen J. McShane et al.

It is certified that error appears in the above-identified patent and that said Letters Patent is hereby corrected as shown below:

In foreign patent documents:
Delete "DE 10 2008 036 5" and insert --DE 10 2008 036 595 A1--

Delete "FR 749 397" and insert --FR 2 749 397--

In other publications:
Delete ""Simple DC-DC Converts Allows Use of Single Battery", Electronix Express, downloaded from http://wwwelexp.com/t_dc-dc.htm, prior to Oct. 1, 2002." and insert --"Simple DC-DC Converts Allows Use of Single Battery", Electronix Express, downloaded from http://www.elexp.com/t_dc-dc.htm, prior to Oct. 1, 2002.--

Signed and Sealed this
Twenty-eighth Day of November, 2017

Joseph Matal
*Performing the Functions and Duties of the*
*Under Secretary of Commerce for Intellectual Property and*
*Director of the United States Patent and Trademark Office*